US012581760B2

(12) United States Patent
Park

(10) Patent No.: US 12,581,760 B2
(45) Date of Patent: Mar. 17, 2026

(54) IMAGE SENSOR

(71) Applicant: SAMSUNG ELECTRONICS CO., LTD., Suwon-si (KR)

(72) Inventor: Sang Chun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 529 days.

(21) Appl. No.: 17/662,476

(22) Filed: May 9, 2022

(65) Prior Publication Data

US 2023/0076351 A1 Mar. 9, 2023

(30) Foreign Application Priority Data

Sep. 8, 2021 (KR) ........................ 10-2021-0119489

(51) Int. Cl.
*H10F 39/00* (2025.01)
*H10F 39/18* (2025.01)

(52) U.S. Cl.
CPC ........... *H10F 39/807* (2025.01); *H10F 39/18* (2025.01); *H10F 39/802* (2025.01); *H10F 39/8063* (2025.01)

(58) Field of Classification Search
CPC ......... H01L 27/14634; H01L 27/14614; H01L 27/14621; H01L 27/14627; H01L 27/14636; H01L 27/14643; H01L 27/14645; H01L 27/1465; H01L 27/14678; H01L 27/14683; H01L 27/14689; H01L 27/14787; H01L 27/1469–14698;

(Continued)

(56) References Cited

U.S. PATENT DOCUMENTS 9,420,209 B2   8/2016   Ahn et al.
9,935,037 B2   4/2018   Kang et al.
(Continued)

FOREIGN PATENT DOCUMENTS

JP       2013-026264       2/2013
KR   10-2004-0093971 A   11/2004
(Continued)

OTHER PUBLICATIONS

Office Action dated Jun. 4, 2025 issued in corresponding Korean Patent Application No. 10-2021-0119489.

*Primary Examiner* — Natalia A Gondarenko
(74) *Attorney, Agent, or Firm* — MORGAN, LEWIS & BOCKIUS LLP

(57) ABSTRACT

An image sensor comprises a substrate that includes a front surface and a rear surface opposite to each other, a plurality of unit pixels disposed in the substrate, where each unit pixel includes a photoelectric conversion layer, a floating diffusion region, and a transfer transistor that electrically connects the photoelectric conversion layer to the floating diffusion region, a pixel isolation pattern that penetrates the substrate in a first direction and defines respective unit pixels, and a microlens disposed on a rear surface of the substrate. The transfer transistor includes a gate electrode that includes a first portion that extends in a second direction along the pixel isolation pattern and a second portion that extends in a third direction along the pixel isolation pattern, and a height from the rear surface of the substrate to a top surface of the gate electrode is less than a thickness of the substrate.

19 Claims, 31 Drawing Sheets

(58) Field of Classification Search
CPC . H01L 27/14806; H01L 27/281; H01L 27/30;
H01L 27/307; H01L 27/14601; H01L
27/1463; H01L 27/14625; H01L
27/14603; H01L 27/14607; H01L
27/14685; H01L 21/3205; H01L 21/768;
H01L 23/3114; H01L 23/522; H01L
23/528; H01L 23/5283; H01L 23/5226;
H01L 23/5329; H01L 23/5384; H01L
23/5386; H01L 23/345; H01L 23/481;
H01L 24/04; H01L 24/05–09; H01L
24/10; H01L 24/12; H01L 24/14; H01L
24/16; H01L 25/0657; H04N 25/70;
H04N 25/7013; H04N 25/709; H04N
25/71; H04N 25/77; H04N 25/79; H10F
39/014; H10F 39/12; H10F 39/151; H10F
39/153; H10F 39/807; H10F 39/18; H10F
39/802; H10F 39/8023; H10F 39/8027;
H10F 39/803; H10F 39/8033; H10F
39/80373; H10F 39/806; H10F 39/8063;
H10F 39/809; H10F 39/811; H10F
39/812
USPC .... 257/431, 448, 294, 774, 777, 31.001, 23,
257/141, 27.13
See application file for complete search history.

(56) References Cited

U.S. PATENT DOCUMENTS

| | | | |
|---|---|---|---|
| 9,935,142 B2 | 4/2018 | Hwangbo et al. | |
| 9,997,556 B2 | 6/2018 | Hwang | |
| 2012/0080732 A1* | 4/2012 | Anderson | H01L 27/14689 |
| | | | 257/292 |
| 2015/0243693 A1* | 8/2015 | Oh | H01L 27/14638 |
| | | | 257/292 |
| 2016/0343751 A1* | 11/2016 | Sze | H01L 27/14621 |
| 2019/0148427 A1 | 5/2019 | Lee | |
| 2020/0266229 A1 | 8/2020 | Takahashi et al. | |
| 2021/0005652 A1* | 1/2021 | Gu | H10F 39/18 |
| 2021/0020676 A1 | 1/2021 | Roy et al. | |
| 2021/0036039 A1 | 2/2021 | Lee et al. | |
| 2022/0059587 A1* | 2/2022 | Zang | H01L 27/14636 |
| 2022/0208823 A1* | 6/2022 | Yoshida | H01L 23/522 |

FOREIGN PATENT DOCUMENTS

| | | |
|---|---|---|
| KR | 10-0532286 A | 11/2005 |
| KR | 10-2007-0063852 | 6/2007 |
| KR | 10-2019-0054447 A | 5/2009 |
| KR | 10-2016-0025939 A | 3/2016 |

* cited by examiner

FIG. 5

IMAGE SENSOR

CROSS-REFERENCE TO RELATED APPLICATION

This application claims priority under 35 U.S.C. 119 from Korean Patent Application No. 10-2021-0119489, filed on Sep. 8, 2021 in the Korean Intellectual Property Office, the contents of which are herein incorporated by reference in their entirety.

1. TECHNICAL FIELD

Embodiments of present disclosure are directed to an image sensor.

2. DISCUSSION OF THE RELATED ART

An image sensing device is a semiconductor device that can convert optical information into electrical signals. Examples of an image sensing device include a charge coupled device (CCD) image sensing device and a complementary metal oxide semiconductor (CMOS) image sensing device.

A CMOS type image sensor may be abbreviated as CIS. A CIS includes a plurality of pixels arranged two-dimensionally. Each of the pixels includes, for example, a photodiode (PD). The photodiode converts incident light into an electrical signal.

The demand for a compact-sized image sensing device that have improved performance has increases in various fields, such as digital cameras, camcorders, smartphones, game devices, security cameras, medical micro-cameras, and robots. Accordingly, research is being conducted on highly scaled and highly integrated semiconductor devices in image sensing devices, so that patterns of semiconductor devices have a fine width and are spaced apart at a fine pitch.

SUMMARY

Embodiments of the present disclosure provide an image sensor with improved performance and reliability.

According to an embodiment of the present disclosure, there is provided an image sensor that includes a substrate that includes a front surface and a rear surface that are opposite to each other, a plurality of unit pixels in the substrate, where each unit pixel includes a photoelectric conversion layer, a floating diffusion region, and a transfer transistor that electrically connects the photoelectric conversion layer to the floating diffusion region, a pixel isolation pattern that penetrates the substrate in a first direction and defines respective unit pixels, and a microlens disposed on the rear surface of the substrate. The transfer transistor includes a gate electrode that includes a first portion that extends in a second direction along the pixel isolation pattern and a second portion that extending in a third direction along the pixel isolation pattern, and a height from the rear surface of the substrate to a top surface of the gate electrode is less than a thickness of the substrate.

According to another embodiment of the present disclosure, there is provided an image sensor that includes a substrate, a first unit pixel disposed in the substrate, where the first unit pixel includes a first photoelectric conversion layer, a first floating diffusion region, and a first transfer transistor that electrically connects the first photoelectric conversion layer to the first floating diffusion region, a second unit pixel disposed in the substrate, where the second unit pixel is spaced apart from the first unit pixel in a first direction and includes a second photoelectric conversion layer, a second floating diffusion region, and a second transfer transistor that electrically connects the second photoelectric conversion layer to the second floating diffusion region, and a pixel isolation pattern that separates the first unit pixel and the second unit pixel. The first transfer transistor includes a first gate electrode that includes a first portion that extends in the first direction along a first portion of a surface of the first unit pixel, and a second portion that extends in a second direction along a second portion of the surface of the first unit pixel that intersects the first portion of the surface of the first unit pixel. The second transfer transistor includes a second gate electrode that includes a first portion that extends in the first direction along a third portion of a surface of the second unit pixel, and a second portion that extends in the second direction along a fourth portion of the surface of the second unit pixel that intersects the third portion of the surface of the second unit pixel, and the second portion of the surface of the first unit pixel and the fourth portion of the surface of the second unit pixel face each other.

According to another embodiment of the present disclosure, there is provided an image sensor that includes first to third semiconductor chips that are sequentially stacked in a first direction. The first semiconductor chip includes a substrate that includes a front surface and a rear surface that are opposite to each other, a plurality of unit pixels disposed in the substrate, where each unit pixel includes a photoelectric conversion layer, a floating diffusion region, and a transfer transistor that electrically connects the photoelectric conversion layer to the floating diffusion region, a pixel isolation pattern that penetrates the substrate in the first direction and defines respective unit pixels, and a microlens disposed on the rear surface of the substrate. The transfer transistor includes a gate electrode that includes a first portion that extends in a second direction along the pixel isolation pattern and a second portion that extends in a third direction along the pixel isolation pattern, and a height from the rear surface of the substrate to a top surface of the gate electrode is less than a thickness of the substrate. The second semiconductor chip includes a source follower transistor, a select transistor and a reset transistor connected to the floating diffusion region, and the third semiconductor chip includes a plurality of logic circuits that control the source follower transistor, the select transistor, and the reset transistor.

BRIEF DESCRIPTION OF THE DRAWINGS

FIG. 5 is an cross-sectional view of an image sensor of FIG. 4.

DETAILED DESCRIPTION

Hereinafter, some embodiments of the present disclosure will be described in detail with reference to the accompanying drawings.

Figure 1:
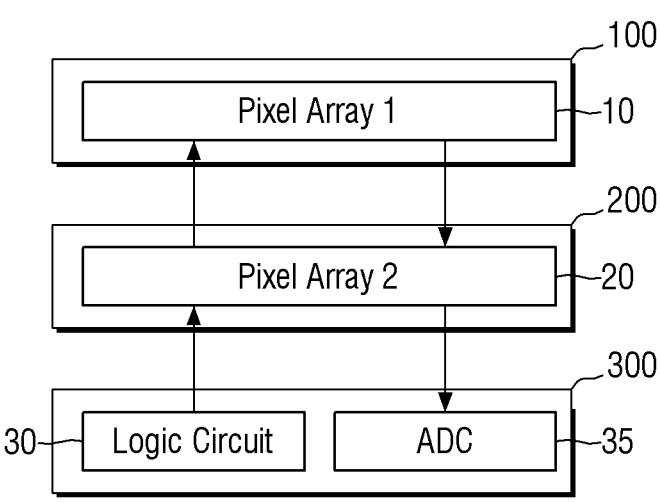
FIG. 1 is a block diagram of an image sensor according to some embodiments.

FIG. 1 is a block diagram of an image sensor according to some embodiments.

Referring to FIG. 1, an image sensor according to some embodiments includes a first semiconductor chip 100, a second semiconductor chip 200, and a third semiconductor chip 300. The first semiconductor chip 100, the second semiconductor chip 200, and the third semiconductor chip 300 overlap each other in a plan view. The first semiconductor chip 100, the second semiconductor chip 200, and the third semiconductor chip 300 are sequentially stacked in a vertical direction. The first semiconductor chip 100 may be referred to as an upper plate, the second semiconductor chip 200 may be referred to as a middle plate, and the third semiconductor chip 300 may be referred to as a lower plate.

The first semiconductor chip 100 includes a first pixel array 10. The second semiconductor chip 200 includes a second pixel array 20. The third semiconductor chip 300 includes a logic circuit 30 and an analog digital converter (ADC) 35. The first pixel array 10 generates electric charge in proportion to an amount of light that reaches the first pixel array 10. The second pixel array 20 converts an optical signal into an electrical signal, that is, an analog signal under the control of the logic circuit 30. The second pixel array 20 outputs the analog signal to the ADC 35. The ADC 35 converts the analog signal into a digital signal. The ADC 35 provides data based on the digital signal.

In addition, an image sensor according to some embodiments further includes a memory cell array. The memory cell array stores the data derived from the digital signal.

The data is image data generated on a frame-by-frame basis. The number of the bits of the data is determined by the resolution of the ADC 35. The number of the bits of the data is determined based on the high dynamic range (HDR) supported by the image sensor. In addition, the data bits further include at least one extension bit that indicates a data generation position, data information, etc.

In an embodiment, the first semiconductor chip 100 and the second semiconductor chip 200 may be formed as one chip. A semiconductor chip that includes a pixel array and a semiconductor chip that includes a logic circuit are stacked on top of each other. An image sensor according to some embodiments of the present disclosure will be described as a 3-stack image sensor that includes the first pixel array 10 and the second pixel array 20 formed on different chips and stacked on top of each other.

Figure 2:
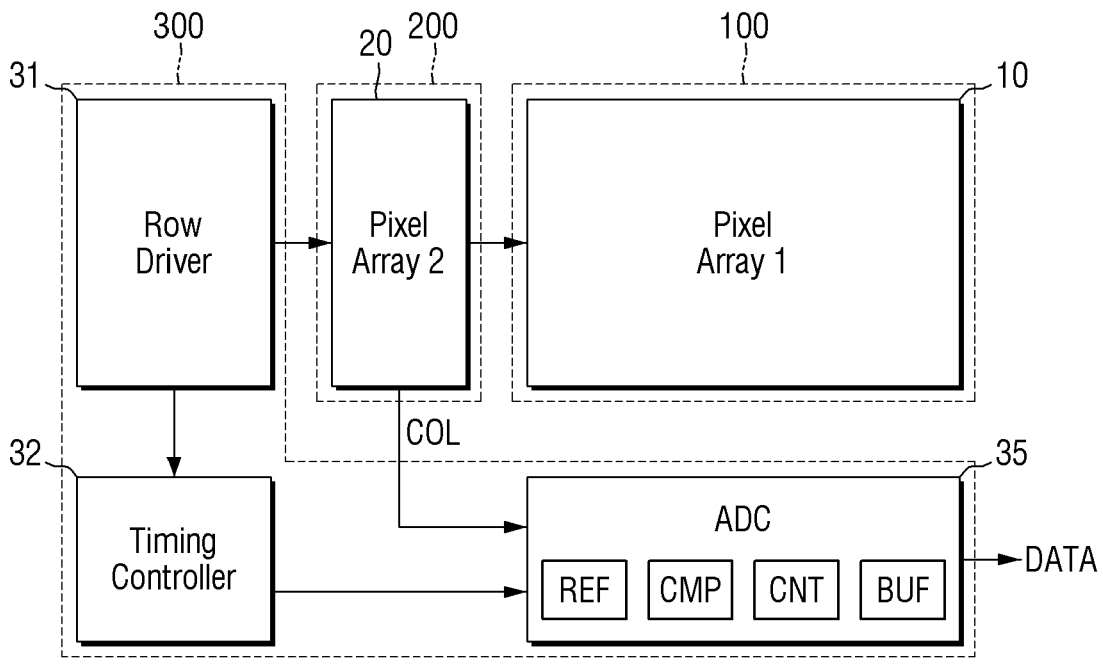
FIG. 2 is a block diagram of a first pixel array, a second pixel array, a logic circuit, and an ADC of FIG. 1.

FIG. 2 is a block diagram od the first pixel array 10, the second pixel array 20, the logic circuit 30, and the ADC 35 of FIG. 1. The logic circuit 30 includes a row driver 31, a timing controller 32.

Referring to FIG. 2, in some embodiments, the first pixel array 10 is implemented in the first semiconductor chip 100. The second pixel array 20 is implemented in the second semiconductor chip 200. The logic circuit 30 and the ADC 35 are implemented in the third semiconductor chip 300.

The first pixel array 10 converts incident light and generates an electrical signal. The second pixel array 20 includes unit pixels arranged in a matrix form along a row direction and a column direction. The second pixel array 20 is driven under the control of the logic circuit. Specifically, the logic circuit 30 controls a plurality of transistors included in the second pixel array 20. The plurality of transistors in the second pixel array 20 control the electrical signal received from the first pixel array 10.

The logic circuit 30 receives data from the second pixel array 20 and generates an image frame. For example, the logic circuit 30 uses one of a global shutter method in which all unit pixels are simultaneously sensed, a flutter shutter method which adjusts an exposure time during which all unit pixels are simultaneously sensed, a coded rolling shutter method or a rolling shutter method in which unit pixels are controlled on a row-by-row basis, etc.

The row driver 31 controls the second pixel array 20 on a row-by-row basis under the control of the timing controller 32. The row driver 31 selects at least one row from the second pixel array 20 according to a row address. The row driver 31 decodes the row address and is connected to a select transistor SEL, shown in FIG. 3, a reset transistor RG, shown in FIG. 3, and a source follower transistor SF, shown in FIG. 3, in the second pixel array 20. The second pixel array 20 is driven by a plurality of driving signals, such as a pixel selection signal, a reset signal, and a charge transfer signal, received from the row driver 31.

The ADC 35 is connected to the second pixel array 20 through column lines COL. The ADC 35 converts analog signals received from the second pixel array 20 through the column lines COL into digital signals. A plurality of ADCs 35 may be provided, and the number of ADCs 35 is determined by the number of the unit pixels in each row and the number of the column lines COL. At least one ADC 35 is provided.

The ADC 35 includes a reference signal generator REF, a comparator CMP, a counter CNT, and a buffer BUF. The reference signal generator REF generates a ramp signal that has a specific gradient and provide the ramp signal as a reference signal to the comparator. The comparator CMP compares the analog signal with the ramp signal received from the reference signal generator REF, and outputs comparison signals that include respective transition points according to valid signal components. The counter CNT generates a counting signal by performing a counting operation, and provides the counting signal to the buffer BUF. The buffer BUF includes latch circuits respectively connected to the column lines COL, and latches the counting signal received from the counter CNT in response to a transition of the comparison signal for each column, and outputs the latched counting signal as data.

In some embodiments, the logic circuit 30 further includes correlated double sampling (CDS) circuits that perform correlated double sampling by calculating a difference between a reference voltage that indicates a reset state of the unit pixels and an output voltage that indicates a signal component that corresponds to the incident light, and outputs an analog sampling signal that corresponds to a valid signal component. The correlated double sampling circuits are connected to the column lines COL.

The timing controller 32 controls operation timings of the row driver 31 and the ADC 35. The timing controller 32 provides a timing signal and a control signal to the row driver 31 and the ADC 35, respectively. More specifically, the timing controller 32 controls the ADC 35, and the ADC 35 provides the data to the logic circuit 30 under the control of the timing controller 32. Further, the timing controller 32 further include circuits that provide a request, a command, or an address to the logic circuit 30 so that the data of the ADC 35 is stored in a memory cell array.

Figure 3:
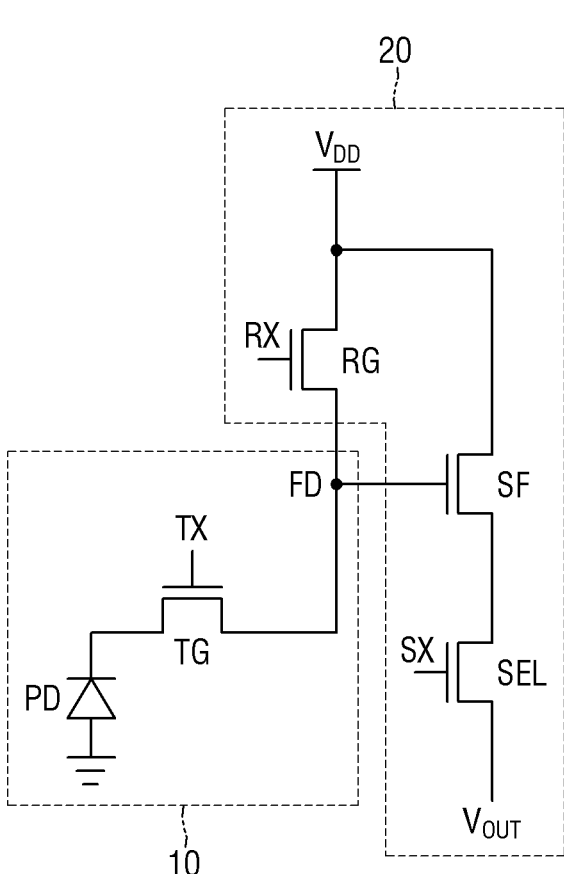
FIG. 3 is a circuit diagram of a unit pixel of a first pixel array and a second pixel array of FIG. 1.

FIG. 3 is a circuit diagram of a unit pixel of the first pixel array 10 and the second pixel array 20 of FIG. 1. For reference, FIG. 3 illustrates a four transistor (4T) structure of a unit pixel that constitutes the first pixel array 10 and the second pixel array 20.

Referring to FIG. 3, in some embodiments, the first pixel array 10 includes a photoelectric conversion layer PD, a transfer transistor TG, and a floating diffusion region FD. The second pixel array 20 includes the reset transistor RG, the source follower transistor SF, and the select transistor SEL.

The photoelectric conversion layer PD generates electric charge in proportion to the amount of light incident from the outside. The photoelectric conversion layer PD is coupled with the transfer transistor TG that transmits the generated and accumulated charge to the floating diffusion region FD. The floating diffusion region FD converts the charge into a voltage, and has a parasitic capacitance so that the charge can be cumulatively stored.

One end of the transfer transistor TG is connected to the photoelectric conversion layer PD, and the other end of the transfer transistor TG is connected to the floating diffusion region FD. The transfer transistor TG is driven by a predetermined bias, such as a transfer signal TX. That is, the transfer transistor TG transmits the charge generated from the photoelectric conversion layer PD to the floating diffusion region FD in response to the transfer signal TX.

The source follower transistor SF amplifies a change in the electrical potential of the floating diffusion region FD that received the charge from the photoelectric conversion layer PD and outputs it to an output line $V_{OUT}$. When the source follower transistor SF is turned on, a predetermined electrical potential, such as a power voltage $V_{DD}$, provided to the drain of the source follower transistor SF, is transmitted to the drain region of the select transistor SEL.

The select transistor SEL selects a unit pixel to be read on a row-by-row basis. The select transistor SEL is driven by a select line through which a predetermined bias, such as a row selection signal SX, is received.

The reset transistor RG periodically resets the floating diffusion region FD. The reset transistor RG is driven by a reset line through which a predetermined bias, such as a reset signal RX, is received. When the reset transistor RG is turned on by the reset signal RX, a predetermined electrical potential, such as the power voltage $V_{DD}$, provided to the drain of the reset transistor RG is transmitted to the floating diffusion region FD.

As shown in the drawing, as the area of the unit pixel decreases, the photoelectric conversion layer PD and the transfer transistor TG are formed on the first semiconductor chip 100 of FIG. 1, and the reset transistor RG, the source follower transistor (SF) and the select transistor SEL are formed on the second semiconductor chip 200 of FIG. 1. The first semiconductor chip and the second semiconductor chip are aligned to form a unit pixel.

Figure 4:
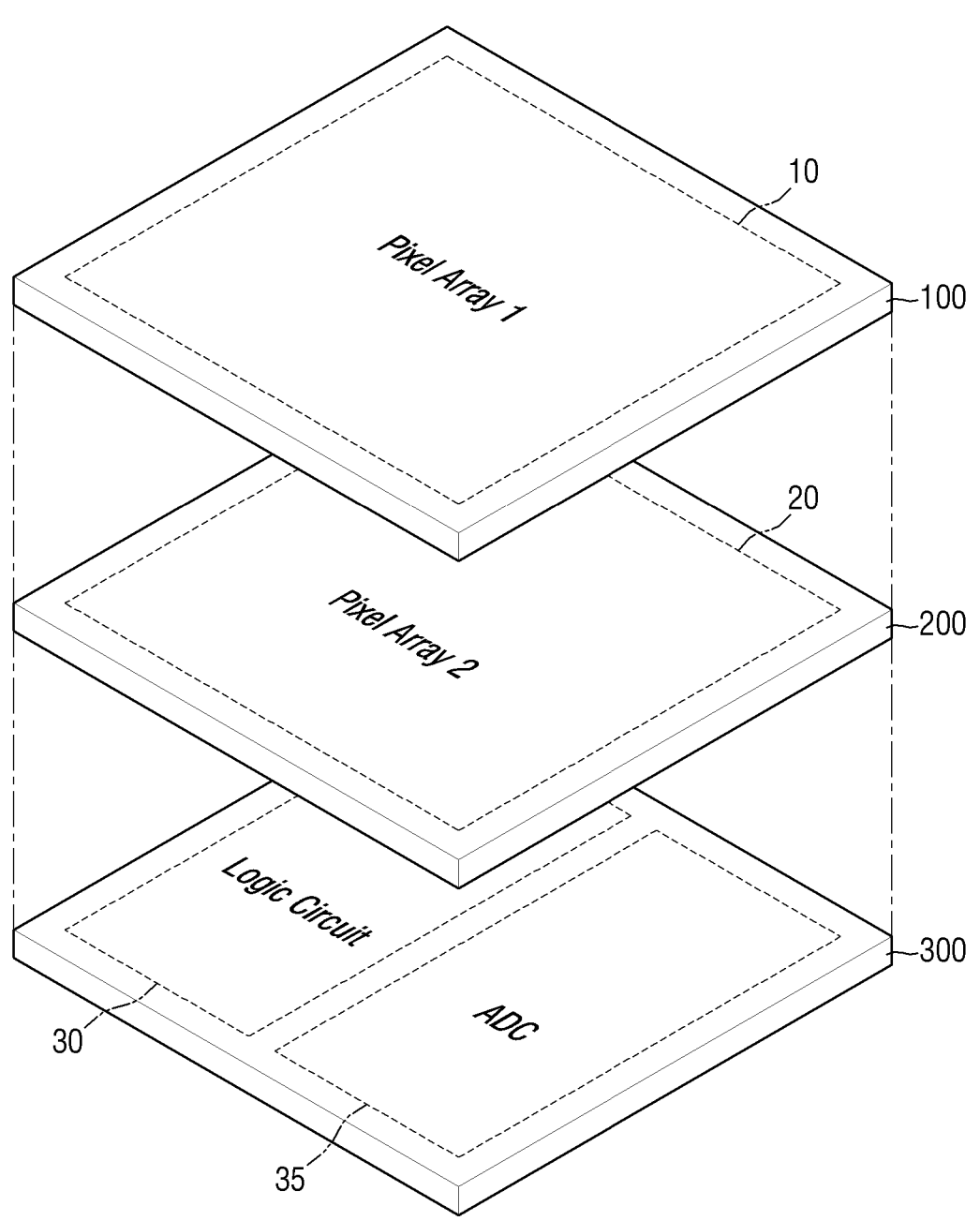
FIG. 4 is a perspective view of a first pixel array, a second pixel array, a logic circuit, and an ADC of the image sensor of FIG. 1.

FIG. 4 is a perspective view of the first pixel array 10, the second pixel array 20, the logic circuit 30, and the ADC 35 of an image sensor of FIG. 1.

Referring to FIG. 4, in an image sensor according to some embodiments, the first to third semiconductor chips 100, 200, and 300 are sequentially stacked. In FIG. 4, the sizes of the first semiconductor chip 100, the second semiconductor chip 200, and the third semiconductor chip 300 are illustrated as being the same, but this for convenience of description, and embodiments of the present disclosure are not limited thereto. In some embodiments, the sizes of the first semiconductor chip 100, the second semiconductor chip 200, and the third semiconductor chip 300 differ from each other. As described above, the first pixel array 10 is disposed on the first semiconductor chip 100, and the second pixel array 20 is disposed on the second semiconductor chip 200. The logic circuit 30 and the ADC 35 are disposed on the third semiconductor chip 300.

In the first semiconductor chip 100, a plurality of unit pixels are arranged in a two-dimensional array structure on a two-dimensional plane. In addition, the first pixel array 10 includes a sensor array region and a pad region. The sensor array region is disposed, for example, in the central portion of the first semiconductor chip 100, and the pad region is disposed, for example, at the periphery of the first semiconductor chip 100, but embodiments of the present disclosure are not limited thereto.

Active pixels that receive light and generate an active signal are arranged in the sensor array region. The second pixel array 20 transmits a control signal to the sensor array region of the first pixel array 10. The second pixel array 20 transmits an output signal of the unit pixel to the logic circuit 30 of the third semiconductor chip 300. The pad region can transmit and receive electrical signals between an unknown sensor and an external device according to some embodiments.

The logic circuit 30 includes circuits that can process pixel signals received from the unit pixels. The logic circuit 30 receives an image signal from the ADC 35 and processes the received image signal.

Figure 5:
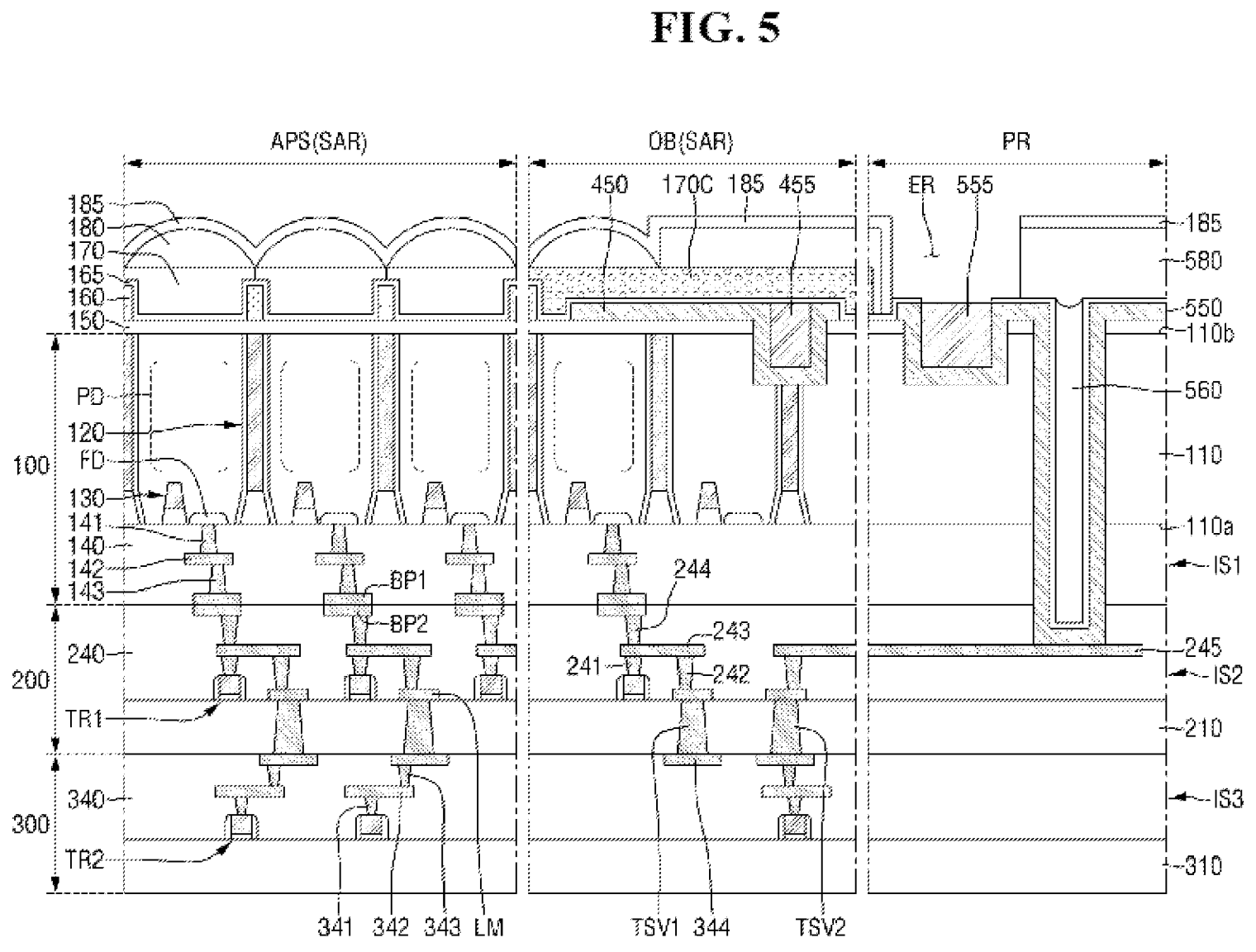

FIG. 5 is a cross-sectional view of an image sensor of FIG. 4.

Referring to FIG. 5, the first semiconductor chip 100 and the second semiconductor chip 200 of an image sensor according to some embodiments include a sensor array region SAR and a pad region PR.

The sensor array region SAR includes areas that correspond to the first pixel array 10 and the second pixel array 20 of FIGS. 1 to 3. For example, a plurality of unit pixels arranged two-dimensionally, e.g., in a matrix form, are formed in the sensor array region SAR.

The sensor array region SAR includes a light receiving region APS and a light blocking region OB. Active pixels that receive light and generate active signals are arranged in the light receiving region APS. Optical black pixels that generate optical black signals by blocking light are arranged in the light blocking region OB. The light blocking region OB is formed, for example, along the periphery of the light receiving region APS, but embodiments are not limited thereto. In some embodiments, dummy pixels are formed in the light receiving region APS adjacent to the light blocking region OB. The dummy pixels are pixels that do not generate an active signal.

The pad region PR is formed around the sensor array region SAR. The pad region PR is adjacent to the edge of an image sensor according to some embodiments, but embodiments are not limited thereto. The pad region PR is connected to an external device, etc., and allows an image sensor according to some embodiments to transmit and receive electrical signals to and from the external device.

An image sensor according to some embodiments includes a first substrate 110, a pixel isolation pattern 120, a first wiring structure IS1, a surface insulating layer 150, a first color filter 170, a grid pattern 160, a microlens 180, a second wiring structure IS2, a second substrate 210, a third wiring structure IS3, a third substrate 310, through vias TSV1 and TSV2, and a second pad 555.

The first substrate 110 is a semiconductor substrate. For example, the first substrate 110 may be a bulk silicon or silicon-on-insulator (SOI) substrate. The first substrate 110 may be a silicon substrate, or may include other materials such as silicon germanium, indium antimonide, lead tellurium compound, indium arsenide, indium phosphide, gallium arsenide, or gallium antimonide. Alternatively, the first substrate 110 may have an epitaxial layer formed on a base substrate.

The first substrate 110 includes a front surface 110a and a rear surface 110b that face each other. In some embodiments, the rear surface 110b of the first substrate 110 is a light-receiving surface on which light is incident. That is, the image sensor according to some embodiments is a backside illuminated (BSI) image sensor.

A plurality of unit pixels are formed on the first substrate 110 of the sensor array region SAR. In addition, a plurality of pixels that are two-dimensionally arranged, e.g., in a matrix form, are formed in the light receiving region APS.

Each unit pixel includes the photoelectric conversion layer PD, the floating diffusion region FD, and a transfer transistor 130. The photoelectric conversion layer PD is formed in the light receiving region APS and the light blocking area OB of the first substrate 110. The photoelectric conversion layer PD generates electric charge in proportion to the amount of light incident from the outside. The photoelectric conversion layer PD transmits the generated and accumulated charge to the floating diffusion region FD.

The floating diffusion region FD is formed in the light receiving region APS and the light blocking region OB of the first substrate 110. The floating diffusion region FD converts electric charge into a voltage. Since the floating diffusion region FD has parasitic capacitance, electric charge can be cumulatively stored.

The transfer transistor 130 is embedded in the first substrate 110. One end of the transfer transistor 130 is connected to the photoelectric conversion layer PD, and the other end of the transfer transistor TG is connected to the floating diffusion region FD. The transfer transistor 130 transmits charge generated by the photoelectric conversion layer PD to the floating diffusion region FD.

The pixel isolation pattern 120 is formed in the sensor array region SAR of the first substrate 110. The pixel isolation pattern 120 is formed, for example, by filling an insulating material in deep trenches formed by patterning the first substrate 110. The pixel isolation pattern 120 penetrates the first substrate 110. For example, the pixel isolation pattern 120 extends from the front surface 110a to the rear surface 110b. The pixel isolation pattern 120 is a front deep trench isolation (FDTI) pattern.

The pixel isolation pattern 120 defines a plurality of unit pixels. The pixel isolation pattern 120 has a grid shape in a plan view that separates the plurality of unit pixels from each other.

The first wiring structure IS1 is formed on the first substrate 110. For example, the first wiring structure IS1 covers the front surface 110a of the first substrate 110. The first substrate 110 and the first wiring structure IS1 constitute the first semiconductor chip 100.

The first wiring structure IS1 includes a plurality of wiring patterns 142, a plurality of contacts 141 and 143, and first bonding pads BP1. For example, the first wiring structure IS1 includes a first inter-wiring insulating layer 140, and the plurality of wiring patterns 142, the plurality of contacts 141 and 143, and the first bonding pads BP1 disposed in the first inter-wiring insulating layer 140. In FIG. 5, the number of the layers of the wiring patterns that constitute the first wiring structure IS1 and the layout thereof are merely exemplary, and embodiments are not limited thereto. The first inter-wiring insulating layer 140 includes, for example, at least one of silicon oxide, silicon nitride, silicon oxynitride, or a low-k material that has a lower dielectric constant than silicon oxide, but embodiments are not limited thereto.

The first contact 141 is connected to the floating diffusion region FD and the first wiring pattern 142. The second contact 143 is connected to the first wiring pattern 142 and the first bonding pad BP1. That is, the floating diffusion region FD, the first wiring pattern 142, and the first bonding pad BP1 are electrically connected to each other.

Each of the first wiring pattern 142, the first contact 141, and the second contact 143 includes, for example, at least one of tungsten (W), copper (Cu), aluminum (Al), gold (Au), silver (Ag), or an alloy thereof, but embodiments are not limited thereto.

The first bonding pad BP1 is disposed in the first inter-wiring insulating layer 140. One surface of the first bonding pad BP1 is exposed by the first inter-wiring insulating layer 140. The bottom surface of the first bonding pad BP1 is coplanar with the bottom surface of the first inter-wiring insulating layer 140. The bottom surface of the first inter-wiring insulating layer 140 faces the rear surface 110b of the first substrate 110. The first bonding pad BP1 is bonded to a second bonding pad BP2 to be described below. The first inter-wiring insulating layer 140 and a second inter-wiring insulating layer 240, described below, are bonded to each other using the first bonding pad BP1 and the second bonding pad BP2.

The first bonding pad BP1 includes, for example, copper (Cu), but embodiments are not limited thereto.

The second substrate 210 may be a bulk silicon or silicon-on-insulator (SOI) substrate. The second substrate 210 may be a silicon substrate, or may include other materials such as silicon germanium, indium antimonide, lead tellurium compound, indium arsenide, indium phosphide, gallium arsenide, or gallium antimonide. Alternatively, the second substrate 210 may have an epitaxial layer formed on a base substrate.

The second substrate 210 includes a top surface and a bottom surface. The top surface of the second substrate 210 faces the first semiconductor chip 100. The bottom surface of the second substrate 210 is opposite to the top surface of the second substrate 210.

First transistors TR1 are formed on the top surface of the second substrate 210. The first transistors TR1 include, for example, a reset transistor (RG in FIG. 3), a source follower transistor (SF in FIG. 3), and a select transistor (SEL in FIG. 3). The first transistors TR1 are electrically connected to the floating diffusion region FD of the first semiconductor chip 100.

The second wiring structure IS2 is formed on the second substrate 210. For example, the second wiring structure IS2 covers the top surface of the second substrate 210. The second substrate 210 and the second wiring structure IS2 constitute the second semiconductor chip 200.

The second wiring structure IS2 is attached to the first wiring structure IS1. For example, as shown in FIG. 5, the top surface of the second wiring structure IS2 is attached to the bottom surface of the first wiring structure IS1. Specifically, the bottom surface of the first inter-wiring insulating layer 140 and the top surface of the second inter-wiring insulating layer 240 are bonded to each other.

The second wiring structure IS2 includes the second inter-wiring insulating layer 240, and a plurality of wiring patterns 243 and 245, a plurality of contacts 241, 242 and 244, the second bonding pad BP2, and a landing metal LM disposed in the second inter-wiring insulating layer 240. In FIG. 5, the number of the layers of the wiring patterns that constitute the second wiring structure IS2 and the layout thereof are merely exemplary, and embodiments are not limited thereto. The second inter-wiring insulating layer 240 includes, for example, at least one of silicon oxide, silicon nitride, silicon oxynitride, or a low-k material that has a lower dielectric constant than silicon oxide, but embodiments are not limited thereto.

The third contact 241 is connected to the first transistor TR1 and the second wiring pattern 243. The fourth contact 242 is connected to the landing metal LM and the second wiring pattern 243. Alternatively, in an embodiment, the fourth contact 242 is connected to the landing metal LM and the third wiring pattern 245. The fifth contact 244 is connected to the second bonding pad BP2 and the second wiring pattern 243. That is, the first transistor TR1 is electrically connected to the floating diffusion region FD using the plurality of contacts, the plurality of wiring patterns, and the bonding pads.

Each of the third contact 241, the fourth contact 242, the fifth contact 244, the second wiring pattern 243, and the third wiring pattern 245 include, for example, at least one of tungsten (W), copper (Cu), aluminum (Al), gold (Au), silver (Ag), or an alloy thereof, but embodiments are not limited thereto.

The second bonding pad BP2 is disposed in the second inter-wiring insulating layer 240.

One surface of the second bonding pad BP2 is exposed by the second inter-wiring insulating layer 240. The top surface of the second bonding pad BP2 is coplanar with the top surface of the second inter-wiring insulating layer 240. The top surface of the second inter-wiring insulating layer 240 faces the front surface 110*a* of the first substrate 110. The second bonding pad BP2 is bonded to the first bonding pad BP1. The first inter-wiring insulating layer 140 and the second inter-wiring insulating layer 240 are bonded to each other using the first bonding pad BP1 and the second bonding pad BP2.

In an embodiment, a first bonding insulating layer is disposed on the bottom surface of the first inter-wiring insulating layer 140. A second bonding insulating layer is disposed on the top surface of the second inter-wiring insulating layer 240. In this case, the first bonding pad BP1 is disposed in the first bonding insulating layer, and the second bonding pad BP2 is disposed in the second bonding insulating layer. The first bonding insulating layer and the second bonding insulating layer are attached to each other.

The third wiring pattern 245 extends from the sensor array region SAR to the pad region PR. The third wiring pattern 245 is electrically connected to the second pad 555 of the pad region PR. The third wiring pattern 245 is connected to a second transistor TR2 through the second through via TSV2 to be described below.

Each of the second wiring pattern 243 and the third wiring pattern 245 includes, for example, at least one of tungsten (W), copper (Cu), aluminum (Al), gold (Au), silver (Ag), or an alloy thereof, but embodiments are not limited thereto.

The landing metal LM is disposed in the second inter-wiring insulating layer 240. One surface of the landing metal LM is exposed by the second inter-wiring insulating layer 240. The bottom surface of the landing metal LM is coplanar with the bottom surface of the second inter-wiring insulating layer 240. The landing metal LM is connected to the through vias TSV1 and TSV2. The landing metal LM includes a conductive material. For example, the landing metal LM is a metal such as copper or lead.

The second substrate 210 further includes through vias TSV1 and TSV2 that penetrate the second substrate 210. Each of the first through via TSV1 and the second through via TSV2 penetrates through the second substrate 210 and is connected to the landing metal LM and a pad metal 344 to be described below. The first through via TSV1 electrically connects the second transistor TR2 and the first transistor TR1. The second through via TSV2 connects the second transistor TR2 and the second pad 555. Each of the first and second through vias TSV1 and TSV2 includes a conductive material.

The third substrate 310 may be a bulk silicon or silicon-on-insulator (SOI) substrate. The third substrate 310 may be a silicon substrate, or may include other materials such as silicon germanium, indium antimonide, lead tellurium compound, indium arsenide, indium phosphide, gallium arsenide, or gallium antimonide. In an embodiment, the third substrate 310 includes an epitaxial layer formed on a base substrate.

The third substrate 310 includes a top surface and a bottom surface. The top surface of the third substrate 310 faces the second semiconductor chip 200. The bottom surface of the third substrate 310 is opposite to the top surface of the third substrate 310.

The second transistors TR2 are formed on the top surface of the third substrate 310. The second transistors TR2 are, for example, the logic circuit of FIG. 1. The second transistors TR2 are electrically connected to the first transistors TR1 of the second semiconductor chip 200.

The third wiring structure IS3 is formed on the third substrate 310. For example, the third wiring structure IS3 covers the top surface of the third substrate 310. The third substrate 310 and the third wiring structure IS3 constitute the third semiconductor chip 300.

The third wiring structure IS3 is attached to the second substrate 210. For example, as shown in FIG. 5, the bottom surface of the second substrate 210 is attached to the top surface of the third wiring structure IS3.

The third wiring structure IS3 includes a third inter-wiring insulating layer 340, and wiring patterns 342, a plurality of contacts 341 and 343, and a pad metal 344 disposed in the third inter-wiring insulating layer 340. In FIG. 5, the number of layers of the wiring patterns that constitute the third wiring structure IS3 and the layout thereof are merely exemplary, and embodiments are not limited thereto. The third inter-wiring insulating layer 340 includes, for example, at least one of silicon oxide, silicon nitride, silicon oxynitride, or a low-k material that has a lower dielectric constant than silicon oxide, but embodiments are not limited thereto.

The sixth contact 341 is connected to the second transistor TR2 and the fourth wiring pattern 342. The seventh contact 343 is connected to the pad metal 344 and the fourth wiring pattern 342. Each of the sixth contact 341, the seventh contact 343, and the fourth wiring pattern 342 includes, for example, at least one of tungsten (W), copper (Cu), aluminum (Al), gold (Au), silver (Ag), or an alloy thereof, but embodiments are not limited thereto.

The pad metal 344 is disposed in the third inter-wiring insulating layer 340. The third inter-wiring insulating layer 340 exposes one surface of the pad metal 344. The exposed pad metal 344 is in contact with the through vias TSV1 and TSV2. The pad metal 344 includes a conductive material. The pad metal 344 includes, for example, copper, but embodiments are not limited thereto.

The surface insulating layer 150 is formed on the rear surface 110b of the first substrate 110. The surface insulating layer 150 extends along the rear surface 110b of the first substrate 110. In some embodiments, at least a portion of the surface insulating layer 150 is in contact with the pixel isolation pattern 120.

The surface insulating layer 150 includes an insulating material. For example, the surface insulating layer 150 includes at least one of silicon oxide, silicon nitride, silicon oxynitride, aluminum oxide, hafnium oxide, or a combination thereof, but embodiments are not limited thereto.

The surface insulating layer 150 functions as an anti-reflection film that prevents reflection of light incident on the first substrate 110, thereby increasing a light receiving rate of the photoelectric conversion layer PD. In addition, the surface insulating layer 150 functions as a planarization layer, so that the first color filter 170 and the microlens 180, which will be described below, can be formed at a uniform height.

The first color filter 170 is formed on the surface insulating layer 150 of the light receiving region APS. In some embodiments, the first color filter 170 is arranged to correspond to each unit pixel. For example, a plurality of first color filters 170 are two-dimensionally arranged, e.g., in a matrix form.

The first color filters 170 include various color filters according to the unit pixels. For example, the first color filters 170 are arranged in a Bayer pattern that includes a red filter, a green filter, and a blue filter. However, embodiments are not limited thereto, and in other embodiments, the first color filters 170 include a yellow filter, a magenta filter, and a cyan filter, and may further include a white filter.

The grid pattern 160 is formed on the surface insulating layer 150. The grid pattern 160 has a grid shape in a plan view and is interposed between the plurality of the first color filters 170.

The grid pattern 160 includes a low refractive index material that has a lower refractive index than silicon (Si). For example, the grid pattern 160 includes at least one of silicon oxide, aluminum oxide, tantalum oxide, or a combination thereof, but embodiments are not limited thereto. The low refractive index material of the grid pattern 160 increases the quality of the image sensor by refracting or reflecting light that is obliquely incident to the image sensor.

In some embodiments, a first passivation layer 165 is formed on the surface insulating layer 150 and the grid pattern 160. The first passivation layer 165 is interposed between the surface insulating layer 150 and the first color filter 170 and between the grid pattern 160 and the first color filter 170. For example, the first passivation layer 165 is conformally formed along the profiles of the top surface of the surface insulating layer 150, and the side and top surfaces of the grid pattern 160.

The first passivation layer 165 includes, for example, aluminum oxide, but embodiments are not limited thereto. The first passivation layer 165 prevents damage to the surface insulating layer 150 and the grid pattern 160.

The microlens 180 is formed on the first color filter 170. The microlens 180 is arranged to correspond to each unit pixel. For example, a plurality of microlenses 180 are two-dimensionally arranged, e.g., in a matrix form, in a plan view.

The microlens 180 has a convex shape and a predetermined radius of curvature.

Accordingly, the microlens 180 condenses light incident on the photoelectric conversion layer PD. The microlens 180 includes an organic material, such as a light transmitting resin, but embodiments are not limited thereto.

In some embodiments, a second passivation layer 185 is formed on the microlens 180. The second passivation layer 185 extends along the surface of the microlens 180. The second passivation layer 185 includes, for example, an inorganic oxide layer. For example, the second passivation layer 185 includes at least one of silicon oxide, titanium oxide, zirconium oxide, hafnium oxide, or a combination thereof, but embodiments are not limited thereto. In some embodiments, the second passivation layer 185 includes low temperature oxide (LTO).

The second passivation layer 185 protects the microlens 180 from the outside. For example, the second passivation layer 185 includes an inorganic oxide layer, thereby protecting the microlenses 180. In addition, the second passivation layer 185 increases the light condensing ability of the microlens 180. For example, the second passivation layer 185 fills a space between the microlenses 180, thereby reducing reflection, refraction, scattering, etc., of incident light that reaches the space between the microlenses 180.

An image sensor according to some embodiments further includes a first connection structure 450 and a second connection structure 550.

The first connection structure 450 is formed in the light blocking region OB. The first connection structure 450 is formed on the surface insulating layer 150 of the light blocking region OB. The first connection structure 450 is in contact with the pixel isolation pattern 120. For example, a first trench that exposes the pixel isolation pattern 120 is formed in the first substrate 110 and the surface insulating layer 150 in the light blocking region OB. The first connection structure 450 is formed in the first trench and is in contact with the pixel isolation pattern 120 in the light blocking region OB. The first connection structure 450 is conformally formed on the profiles of the side surface and the bottom surface of the first trench.

The first connection structure 450 is electrically connected to the pixel isolation pattern 120 and applies a ground voltage or a negative voltage to the pixel isolation pattern 120. Accordingly, charge generated by an electrostatic discharge (ESD), etc., can be discharged to the first connection structure 450 through the pixel isolation pattern 120, and ESD bruise defect can be effectively prevented.

The first connection structure 450 includes, for example, a titanium (Ti) film, a titanium nitride (TiN) film, and a tungsten (W) film that are sequentially stacked.

In some embodiments, a first pad 455 that fills the first trench is formed on the first connection structure 450. The first pad 455 includes, for example, at least one of tungsten (W), copper (Cu), aluminum (Al), gold (Au), silver (Ag), or an alloy thereof, but embodiments are not limited thereto.

In some embodiments, a second color filter 170C is disposed on the rear surface 110b of the first substrate 110 in the light blocking region OB. The second color filter 170C covers the first connection structure 450. The second color filter 170C covers a portion of the first passivation layer 165 inside the light blocking region OB. In an embodiment, the second color filter 170C includes, for example, a blue color filter. However, embodiments of the present inventive concept are not limited thereto.

In some embodiments, the first passivation layer 165 covers the first connection structure 450 and the first pad 455. For example, the first passivation layer 165 is conformally formed on the profiles of the first connection structure 450 and the first pad 455.

The second connection structure 550 is formed in the pad region PR. The second connection structure 550 is formed on the surface insulating layer 150 of the pad region PR. The second connection structure 550 electrically connects the third semiconductor chip 300 to an external device, etc.

A second trench that exposes the third wiring pattern 245 is formed in the pad region PR of the first semiconductor chip 100 and the second semiconductor chip 200. The second connection structure 550 is formed in the second trench and is in contact with the third wiring pattern 245. In addition, a third trench is formed in the first substrate 110 of the pad region PR. The second connection structure 550 is exposed in the third trench. In some embodiments, the second connection structure 550 is conformally formed along the profiles of the side surfaces and the bottom surfaces of the second and third trenches.

In some embodiments, a filling insulating layer 560 that fills the second trench is formed on the second connection structure 550. The filling insulating layer 560 includes, for example, at least one of silicon oxide, aluminum oxide, tantalum oxide, or a combination thereof, but embodiments are not limited thereto.

In some embodiments, the second pad 555 that fills the third trench is formed on the second connection structure 550. The second pad 555 includes, for example, at least one of tungsten (W), copper (Cu), aluminum (Al), gold (Au), silver (Ag), or an alloy thereof, but embodiments are not limited thereto. The second connection structure 550 includes a titanium (Ti) film, a titanium nitride (TiN) film, and a tungsten (W) film that are sequentially stacked in the second trench.

A third passivation layer is formed in the pad region PR and the light blocking region OB of the first semiconductor chip 100 and the second semiconductor chip 200. In some embodiments, the second passivation layer 185 and the third passivation layer 580 expose the second pad 555. For example, an exposure opening ER that exposes the second pad 555 is formed in the second passivation layer 185 and the third passivation layer 580. Accordingly, the second pad 555 is connected to an external device, etc., to allow an image sensor according to some embodiments to transmit and receive electrical signals to and from the external device.

Figure 6:
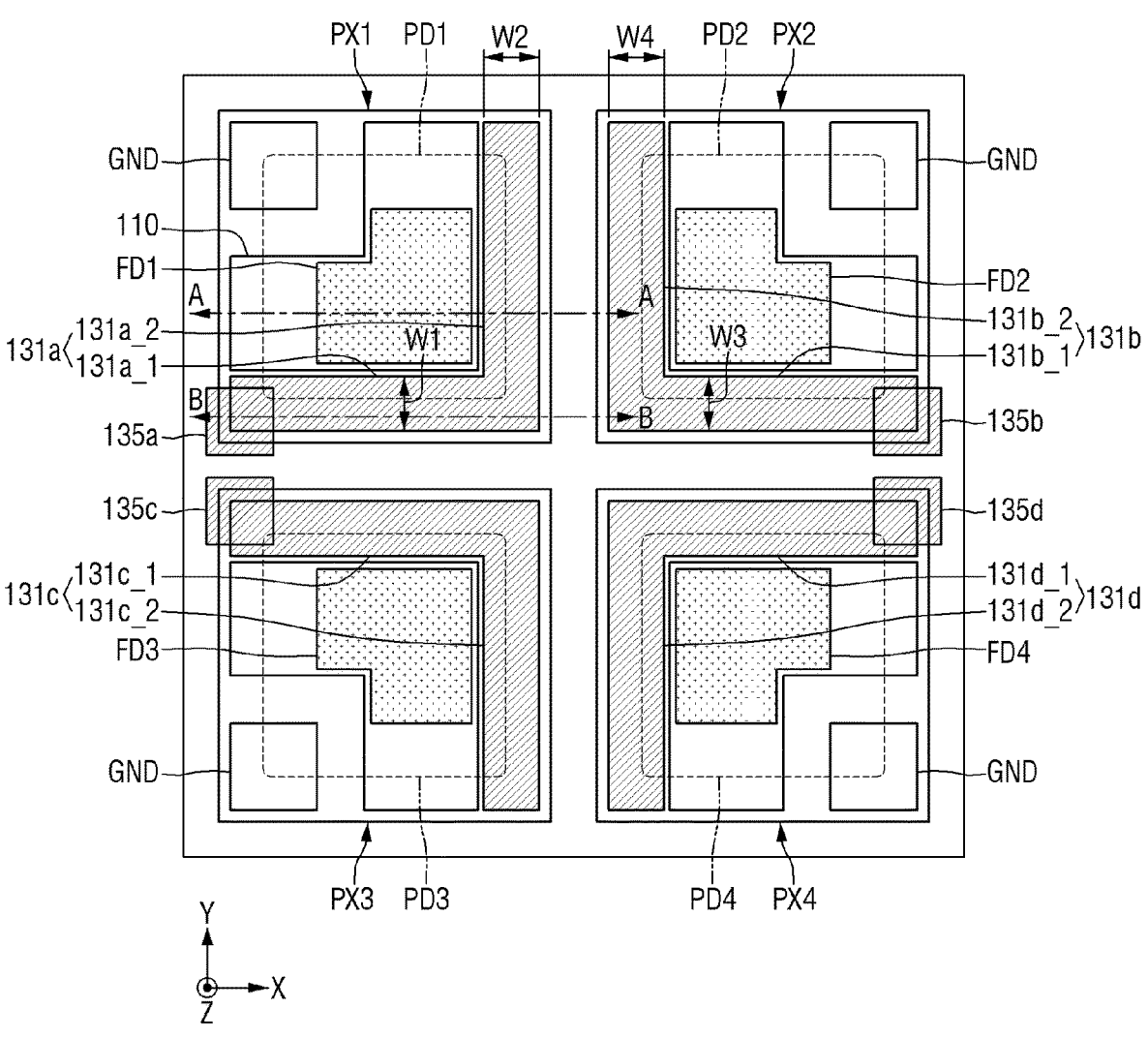
FIG. 6 is an plan view of a first semiconductor chip of FIG. 4.
Figure 7:
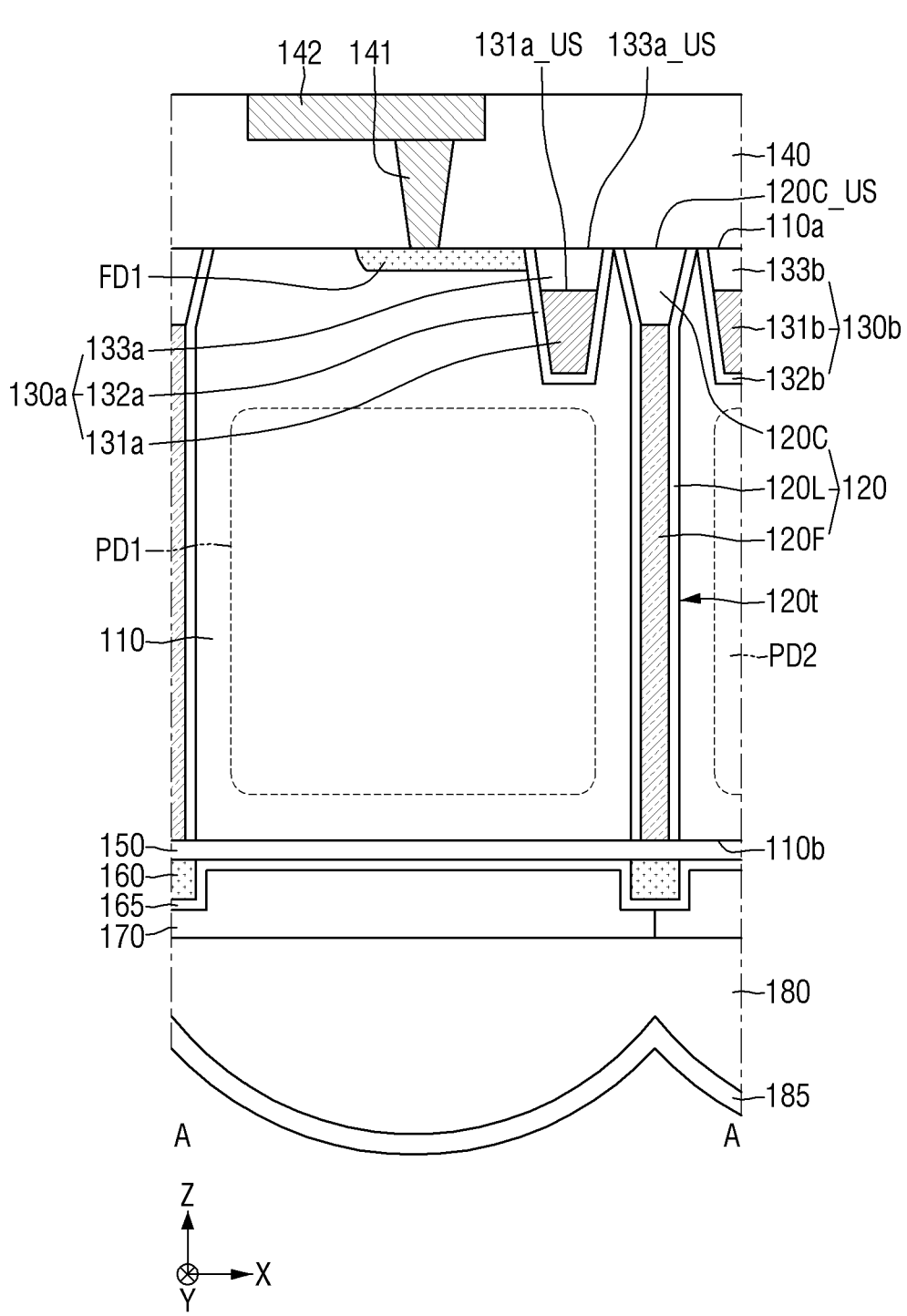
FIG. 7 is a cross-sectional view taken along line A-A of FIG. 6.
Figure 8:
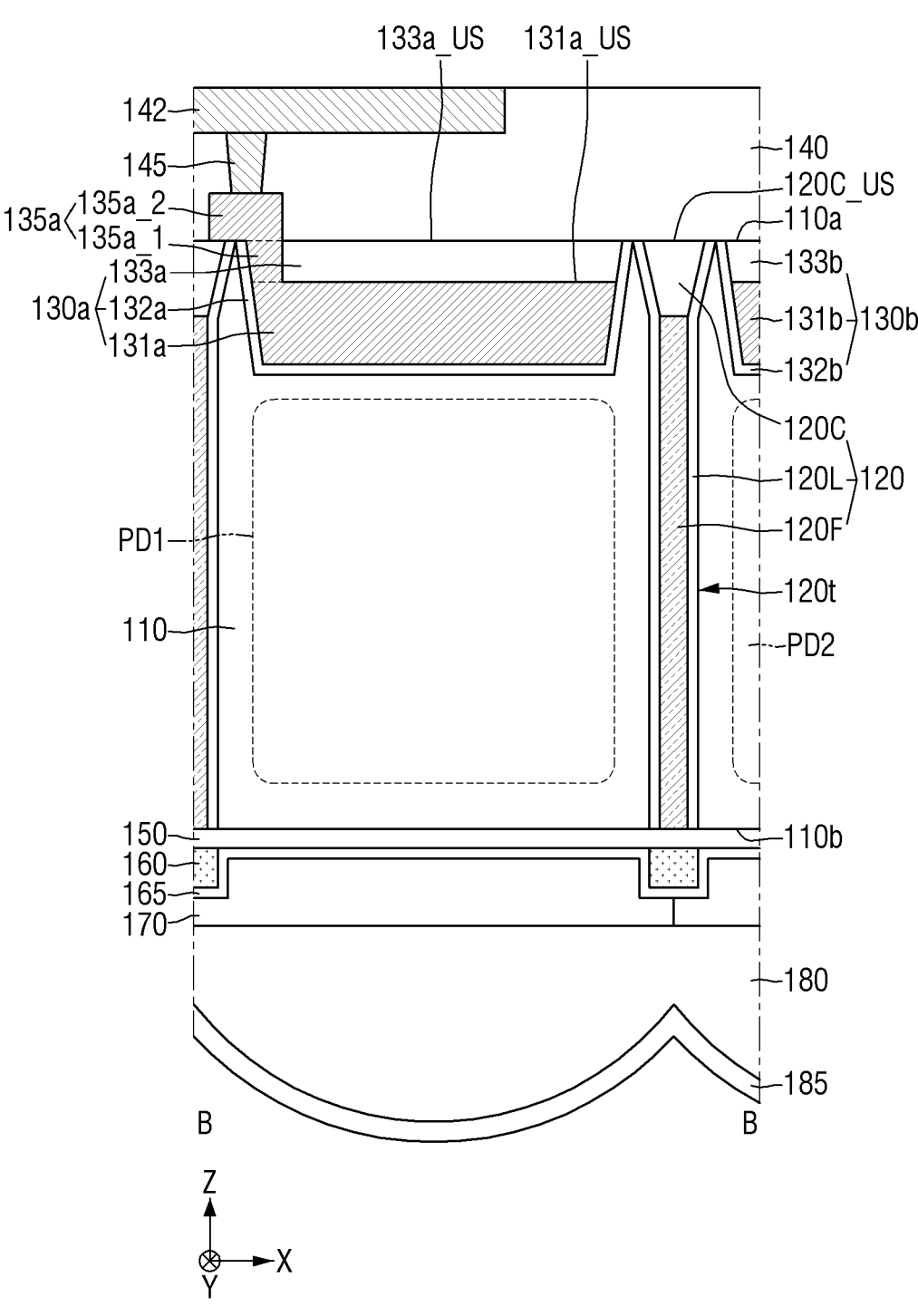
FIG. 8 is a cross-sectional view taken along line B-B of FIG. 6.

FIG. 6 is a plan view of the first semiconductor chip 100 of FIG. 4. FIG. 7 is a cross-sectional view taken along line A-A of FIG. 6. FIG. 8 is a cross-sectional view taken along line B-B of FIG. 6. For reference, FIGS. 6 to 8 illustrate a part of the first semiconductor chip of FIG. 5. Hereinafter, the first semiconductor chip 100 will be described in further detail with reference to FIGS. 6 to 8.

Referring to FIGS. 6 to 8, in some embodiments, the first to the fourth unit pixels PX1, PX2, PX3, and PX4 are provided on a plane that extends in the first direction X and the second direction Y. Although the first semiconductor chip is illustrated as including four unit pixels, this is for convenience of description, and embodiments are not limited thereto. In other embodiments, four or more unit pixels are provided.

The first unit pixel PX1 is spaced apart from the second unit pixel PX2 in the first direction X. The third unit pixel PX3 is spaced apart from the first unit pixel PX1 in the second direction Y. The fourth unit pixel PX4 is spaced apart from the third unit pixel PX3 in the first direction X and from the second unit pixel PX2 in the second direction Y. The first direction X, the second direction Y, and the third direction Z intersect each other.

The first to fourth unit pixels PX1, PX2, PX3, and PX4 may be defined by the pixel isolation pattern 120. The pixel isolation pattern 120 has a grid shape that separates the first to fourth unit pixels PX1, PX2, PX3, and PX4.

The pixel isolation pattern 120 penetrates the first substrate 110 in the third direction Z. The bottom surface of the pixel isolation pattern 120 is coplanar with the rear surface 110b of the first substrate 110. The top surface of the pixel isolation pattern 120 is coplanar with the front surface 110a of the first substrate 110. The top surface of the pixel isolation pattern 120 is a top surface 120C_US of a pixel isolation capping layer 120C. The top surface 120C_US of the pixel isolation capping layer 120C is coplanar with the front surface 110a of the first substrate 110.

The pixel isolation pattern 120 includes a pixel isolation liner layer 120L, a pixel isolation filling layer 120F, and the pixel isolation capping layer 120C. The pixel isolation liner layer 120L is disposed along the inner wall of a pixel isolation trench 120t. The pixel isolation filling layer 120F is disposed between the pixel isolation liner layers 120L. The pixel isolation capping layer 120C is disposed on the pixel isolation filling layer 120F.

The pixel isolation liner layer 120L includes an oxide layer that has a lower refractive index than that of the first substrate 110. For example, the pixel isolation liner layer 120L includes at least one of silicon oxide, aluminum oxide, tantalum oxide, or a combination thereof, but embodiments are not limited thereto. Due to a refractive index that is lower than that of the first substrate 110, the pixel isolation liner layer 120L refracts or reflects light that is obliquely incident to the photoelectric conversion layer PD. In addition, the pixel isolation liner layer 120L prevent photocharges generated in a specific unit pixel by the incident light from moving to an adjacent unit pixel due to random drift. That is, the pixel isolation liner layer 120L increases the light receiving rate of the photoelectric conversion layer PD, thereby increasing the quality of an image sensor according to some embodiments.

In some embodiments, the pixel isolation filling layer 120F includes a conductive material. For example, the pixel isolation filling layer 120F includes polysilicon (poly Si), but embodiments are not limited thereto. In some embodiments, a ground voltage or a negative voltage is applied to the pixel isolation filling layer 120F. Accordingly, an ESD bruise defect is effectively prevented. Here, the ESD bruise defect refers to a phenomenon in which electric charge generated by ESD, etc., accumulate on a surface, such as the rear surface 110b, of the substrate, thereby causing a stain such as a bruise in the generated image.

In some embodiments, the pixel isolation capping layer 120C includes an insulating material. For example, the pixel isolation capping layer 120C includes an oxide-based insulating material, but embodiments are not limited thereto.

The first unit pixel PX1 includes a first photoelectric conversion layer PD1, a first floating diffusion region FD1, and a first transfer transistor 130a. The second unit pixel PX2 includes a second photoelectric conversion layer PD2, a second floating diffusion region FD2, and a second transfer transistor 130b. The third unit pixel PX3 includes a third photoelectric conversion layer PD3, a third floating diffusion region FD3, and a third transfer transistor. The fourth unit pixel PX4 includes a fourth photoelectric conversion layer PD4, a fourth floating diffusion region FD4, and a fourth transfer transistor. In addition, each of the first to fourth unit pixels PX1, PX2, PX3, and PX4 may include a ground region GND.

The ground region GND is disposed in the first substrate 110. In addition, the ground region GND is separated by an element isolation layer. The ground region GND has a relatively low potential. The ground region GND is doped with a P-type impurity, but embodiments are not limited thereto.

The first transfer transistor 130a electrically connects the first floating diffusion region FD1 and the first photoelectric conversion layer PD1 to each other. The second transfer transistor 130b electrically connects the second floating diffusion region FD2 and the second photoelectric conversion layer PD2 to each other. The third transfer transistor electrically connects the third floating diffusion region FD3 and the third photoelectric conversion layer PD3 to each other. The fourth transfer transistor electrically connects the fourth floating diffusion region FD4 and the fourth photoelectric conversion layer PD4 to each other.

The first transfer transistor 130a includes a first gate electrode 131a, a first gate insulating layer 132a, and a first gate capping layer 133a. The first gate insulating layer 132a is disposed along the sidewall and the bottom surface of a first gate trench formed in the first substrate 110. The first gate electrode 131a fills a portion of the first gate trench on the first gate insulating layer 132a. The first gate capping layer 133a fills the remaining portion of the first gate trench on the first gate electrode 131a.

The first gate electrode 131a is buried in the first substrate 110. A top surface 131a_US of the first gate electrode 131a is located below the front surface 110a of the first substrate 110. In other words, the thickness of the first substrate 110 in the third direction Z is greater than the height from the rear surface 110b of the first substrate 110 to the top surface 131a_US of the first gate electrode 131a. With respect to the rear surface 110b of the first substrate 110, the top surface 131a_US of the first gate electrode 131a is lower than the front surface 110a of the first substrate 110.

The top surface 133a_US of the first gate capping layer 133a is coplanar with the front surface 110a of the first substrate 110. The top surface 133a_US of the first gate capping layer 133a is coplanar with the top surface 120C_US of the pixel isolation capping layer 120C.

At least a portion of the first gate electrode 131a overlaps the pixel isolation filling layer 120F in the first direction X and the second direction Y. For example, based on the rear surface 110b of the first substrate 110, the top surface 131a_US of the first gate electrode 131a is higher than the top surface of the pixel isolation filling layer 120F. At least a portion of the first gate electrode 131a overlaps the pixel isolation capping layer 120C in the first direction X and the second direction Y.

The first gate insulating layer 132a includes an insulating material. For example, the first gate insulating layer 132a includes silicon oxide. The first gate electrode 131a includes a conductive material. For example, the first gate electrode 131a includes polysilicon. The first gate capping layer 133a includes an insulating material. For example, the first gate capping layer 133a includes silicon oxide or silicon nitride. However, embodiments of the present disclosure are not limited thereto.

The second transfer transistor 130b includes a second gate electrode 131b, a second gate insulating layer 132b, and a second gate capping layer 133b. A description of the second gate electrode 131b, the second gate insulating layer 132b, and the second gate capping layer 133b is substantially the same as the description of the first gate electrode 131a, the first gate insulating layer 132a, and the first gate capping layer 133a. Likewise, a description of the third transfer transistor and the fourth transfer transistor is substantially the same as the description of the first transfer transistor 131a.

In FIG. 6, in some embodiments, the first gate electrode 131a includes a first portion 131a_1 that extends in the first direction X and a second portion 131a_2 that extends in the second direction Y. The first portion 131a_1 of the first gate electrode and the second portion 131a_2 of the first gate electrode extend along the pixel isolation pattern 120. For example, the first portion 131a_1 of the first gate electrode extends along a first surface of the first unit pixel PX1. The second portion 131a_2 of the first gate electrode extends along a second surface of the first unit pixel PX1. The first surface and the second surface intersect each other. The first surface is a bottom side portion of the top surface of the first unit pixel PX1. The second surface is a right side portion of the top surface of the first unit pixel PX1.

The second gate electrode 131b includes a first portion 131b_1 that extends in the first direction X and a second portion 131b_2 that extends in the second direction Y. The first portion 131b_1 of the second gate electrode and the second portion 131b_2 of the second gate electrode extend along the pixel isolation pattern 120. For example, the first portion 131b_1 of the second gate electrode extends along a third surface of the second unit pixel PX2. The second portion 131b_2 extends along a fourth surface of the second unit pixel PX2. The third side and the fourth side intersect each other. The third surface is a bottom side portion of the top surface of the second unit pixel PX2. The fourth surface is a left side portion of the top surface of the second unit pixel PX2.

The second surface of the first unit pixel PX1 faces the fourth surface of the second unit pixel PX2. In addition, the first portion 131a_1 of the first gate electrode and the first portion 131b_1 of the second gate electrode overlap each other in the first direction X.

The third gate electrode 131c includes a first portion 131c_1 that extends in the first direction X and a second portion 131c_2 that extends in the second direction Y. The first portion 131c_1 of the third gate electrode and the second portion 131c_2 of the third gate electrode extend along the pixel isolation pattern 120. For example, the first portion 131c_1 of the third gate electrode extends along a fifth surface of the third unit pixel PX3. The second portion 131c_2 of the third gate electrode extends along a sixth surface of the third unit pixel PX3. The fifth surface and the sixth surface intersect each other. The fifth surface is a top side portion of the top surface of the third unit pixel PX3. The sixth surface is a right side portion of the top surface of the third unit pixel PX3.

The first surface of the first unit pixel PX1 faces the fifth surface of the third unit pixel PX3. In addition, the second portion 131a_2 of the first gate electrode and the second portion 131c_2 of the third gate electrode overlap each other in the second direction Y.

The fourth gate electrode 131d includes a first portion 131d_1 that extends in the first direction X and a second portion 131d_2 that extends in the second direction Y. The first portion 131d_1 of the fourth gate electrode and the second portion 131d_2 of the fourth gate electrode extend along the pixel isolation pattern 120. For example, the first portion 131d_1 of the fourth gate electrode extends along a seventh surface of the fourth unit pixel PX4. The second portion 131d_2 of the fourth gate electrode extends along an eighth surface of the fourth unit pixel PX4. The seventh surface and the eighth surface intersect each other. The seventh surface is a top side portion of the top surface of the fourth unit pixel PX4. The eighth surface is a left side portion of the top surface of the fourth unit pixel PX4.

The third surface of the second unit pixel PX2 faces the seventh surface of the fourth unit pixel PX4. The sixth surface of the third unit pixel PX3 faces the eighth surface of the fourth unit pixel PX4. Also, the second portion 131b_2 of the second gate electrode and the second portion 131d_2 of the fourth gate electrode overlaps each other in the second direction Y. The first portion 131c_1 of the third gate electrode overlaps the first portion 131d_1 of the fourth gate electrode in the first direction X.

A width W1 of the first portion 131a_1 of the first gate electrode in the second direction Y, a width W2 of the second portion 131a_2 of the first gate electrode in the first direction X, a width W3 of the first portion 131b_1 of the second gate electrode in the second direction Y, and a width W4 of the second portion 131b_2 of the second gate electrode in the first direction X are equal to each other. That is, the first gate electrode 131a and the second gate electrode 131b are symmetric about the Y-axis.

The first gate electrode 131a and the third gate electrode 131c are symmetric about the X-axis, and the first gate electrode 131a and the fourth gate electrode 131d are symmetric about the origin. However, embodiments of the present disclosure are not limited thereto.

For example, the gate electrodes 131a, 131b, 131c, and 131d of the transfer transistor have an L shape that extend in the first direction X and the second direction Y. Accordingly, the gate electrodes 131a, 131b, 131c, and 131d can be easily formed on a small unit pixel.

The first floating diffusion region FD1 is disposed in the first substrate 110. The first floating diffusion region FD1 does not overlap the first gate electrode 131a in the first direction X, the second direction Y, or the third direction Z. For example, the bottom surface of the first floating diffusion region FD1 is higher than the top surface of the first gate electrode 131a with respect to the rear surface 110b of the first substrate 110a. The first floating diffusion region FD1 does not overlap the ground region GND in the first direction X, the second direction Y, or the third direction Z.

Since the first floating diffusion region FD1 does not overlap the first gate electrode 131a in the first direction X, the second direction Y, or the third direction Z, a leakage current flow between the first floating diffusion region FD1 and the first gate electrode 131a can be prevented.

The first floating diffusion region FD1 is disposed in a central region of the first unit pixel PX1. In addition, the first portion 131a_1 of the first gate electrode is disposed on one side of the first floating diffusion region FD1, and the second portion 131a_2 of the first gate electrode is disposed on the other side of the first floating diffusion region FD1. Thus, an effect similar to that of a dual transfer transistor can occur.

The description of the second to fourth floating diffusion regions FD2, FD3, and FD4 is substantially the same as the description of the first floating diffusion region FD1.

An image sensor according to some embodiments further includes a first via 135a, a second via 135b, a third via 135c, and a fourth via 135d.

The first via 135a is disposed on the first gate electrode 131a and the pixel isolation pattern 120. At least a part of the first via 135a overlaps the first portion 131a_1 of the first gate electrode 131a in the third direction Z. At least a part of the first via 135a overlaps the pixel isolation pattern 120 in the third direction Z.

The second via 135b is disposed on the second gate electrode 131b and the pixel isolation pattern 120. At least a part of the second via 135b overlaps the first portion 131b_1 of the second gate electrode 131b in the third direction Z. At least a part of the second via 135b overlaps the pixel isolation pattern 120 in the third direction Z.

The third via 135c is disposed on the third gate electrode 131c and the pixel isolation pattern 120. At least a part of the third via 135c overlaps the first portion 131c_1 of the third gate electrode 131c in the third direction Z. At least a part of the third via 135c overlaps the pixel isolation pattern 120 in the third direction Z.

The fourth via 135d is disposed on the fourth gate electrode 131d and the pixel isolation pattern 120. At least a part of the fourth via 135d overlaps the first portion 131d_1 of the fourth gate electrode 131d in the third direction Z. At least a part of the fourth via 135d overlaps the pixel isolation pattern 120 in the third direction Z.

In FIG. 8, the first via 135a includes a first region 135a_1 that penetrates through the first gate capping layer 133a, and a second region 135a_2 disposed on the front surface 110a of the first substrate 110. The first region 135a_1 of the first via 135a is connected to the first gate electrode 131a. The second region 135a_2 of the first via 135a is disposed in the first inter-wiring insulating layer 140. The second region 135a_2 of the first via 135a protrudes from the front surface 110a of the first substrate 110.

A description of the second to fourth vias 135b, 135c, and 135d is substantially the same as the description of the first via 135a.

Each of the first to fourth vias 135a, 135b, 135c, and 135d includes a conductive material. The first to fourth vias 135a, 135b, 135c, and 135d include the same material as the first to fourth gate electrodes 131a, 131b, 131c, and 131d. For example, the first to fourth vias 135a, 135b, 135c, and 135d include polysilicon, but embodiments are not limited thereto.

In some embodiments, the image sensor further includes a via contact 145.

The via contact 145 is disposed on the first via 135a. The via contact 145 is connected to the second region 135a_2 of the first via 135a. The via contact 145 is disposed in the first inter-wiring insulating layer 140. The via contact 145 connects the first wiring pattern 142 and the first via 135a. The via contact 145 connects the first wiring pattern 142 and the first gate electrode 131a. In addition, the via contact 145 is also disposed on the second via 135b, the third via 135c, and the fourth via 135d.

The via contact 145 includes a conductive material. For example, the via contact 145 includes at least one of tungsten (W), copper (Cu), aluminum (Al), gold (Au), silver (Ag), or an alloy thereof, but embodiments are not limited thereto.

Figure 9A:
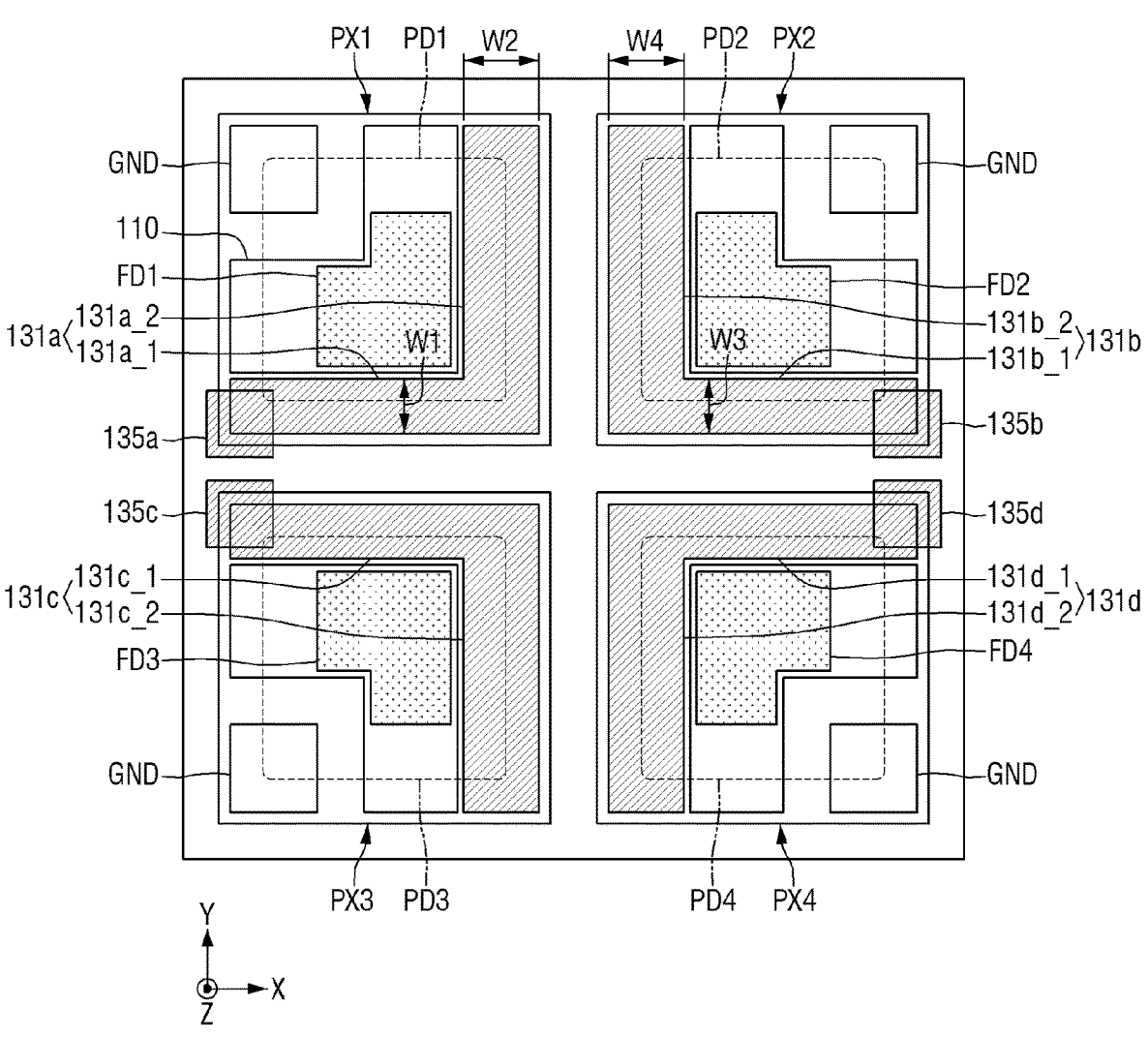
FIG. 9A and FIG. 9B are plan views of an image sensor according to some embodiments.
Figure 9B:
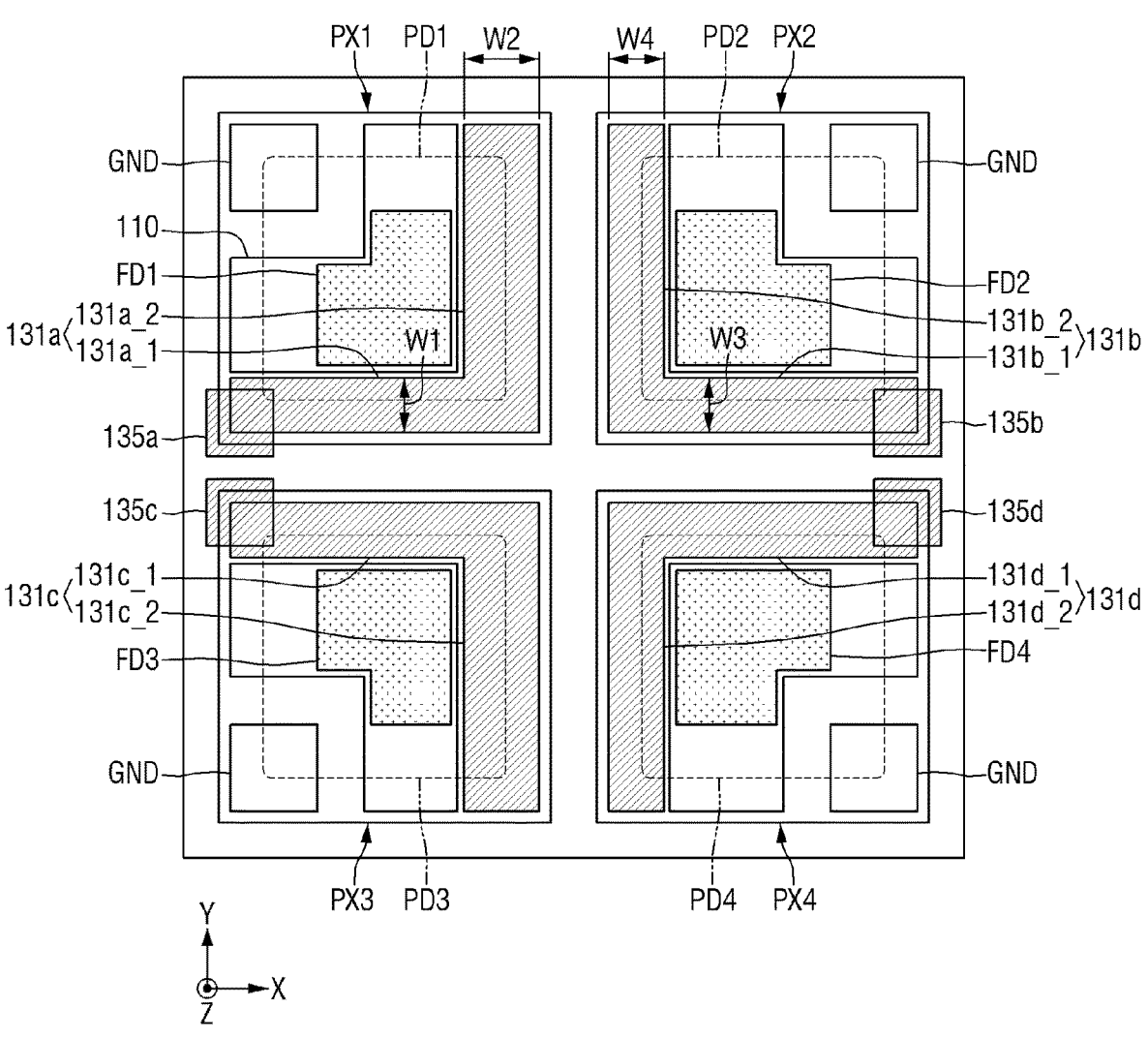

FIG. 9A and FIG. 9B are plan views of an image sensor according to some embodiments.

For simplicity of description, the following description will focus on differences from the description with reference to FIGS. 6 to 8.

Referring to FIG. 9A, in some embodiments, the width W2 of the second portion 131a_2 of the first gate electrode in the first direction X is greater than the width W1 of the first portion 131a_1 of the first gate electrode in the second direction Y.

The width W4 of the second portion 131b_2 of the second gate electrode in the first direction X is greater than the width W3 of the first portion 131b_1 of the second gate electrode in the second direction Y. The width W1 of the first portion 131a_1 of the first gate electrode in the second direction Y is equal to the width W3 of the first portion 131b_1 of the second gate electrode in the second direction Y. The width W2 of the second portion 131a_2 of the first gate electrode in the first direction X is equal to the width W4 of the second portion 131b_2 of the second gate electrode in the first direction X. That is, the first gate electrode 131a and the second gate electrode 131b are symmetric about the Y-axis.

The width of the second portion 131c_2 of the third gate electrode in the first direction X is equal to the width W2 of the second portion 131a_2 of the first gate electrode in the first direction X. The width of the first portion 131c_1 of the third gate electrode in the second direction Y is equal to the width W1 of the first portion 131a_1 of the first gate electrode in the second direction Y. The first gate electrode 131a and the third gate electrode 131c re symmetric about the X-axis.

The width of the second portion 131d_2 of the fourth gate electrode in the first direction X is equal to the width W4 of the second portion 131b_2 of the second gate electrode in the first direction X. The width of the first portion 131d_1 of the fourth gate electrode in the second direction Y is equal to the width W3 of the first portion 131b_1 of the second gate electrode in the second direction Y. The second gate electrode 131b and the fourth gate electrode 131d are symmetric about the X-axis.

Referring to FIG. 9B, the width W2 of the second portion 131a_2 of the first gate electrode in the first direction X is greater than the width W1 of the first portion 131a_1 of the first gate electrode in the second direction Y. However, the width W4 of the second portion 131b_2 of the second gate electrode in the first direction X is equal to the width W3 of the first portion 131b_1 of the second gate electrode in the second direction Y.

The width W1 of the first portion 131a_1 of the first gate electrode in the second direction Y, the width W3 of the first portion 131b_1 of the second gate electrode in the second direction Y, and the width W4 of the second portion 131b_2 of the second gate electrode in the first direction X are equal to each other. That is, the first gate electrode 131a and the second gate electrode 131b are not symmetric about the Y-axis.

The width W2 of the second portion 131a_2 of the first gate electrode in the first direction X is equal to the width of the second portion 131c_2 of the third gate electrode in the first direction X. The width W1 of the first portion 131a_1 of the first gate electrode in the second direction Y is equal to the width of the first portion 131c_1 of the third gate electrode in the second direction Y. The first gate electrode 131a and the third gate electrode 131c are symmetric about the X-axis.

The width W4 of the second portion 131b_2 of the second gate electrode in the first direction X is equal to the width of the second portion 131d_2 of the fourth gate electrode in the first direction X. The width W3 of the first portion 131b_1 of the second gate electrode in the second direction Y is equal to the width of the first portion 131d_1 of the fourth gate electrode in the second direction Y. The second gate electrode 131b and the fourth gate electrode 131d are symmetric about the X-axis. However, the first gate electrode 131a and the fourth gate electrode 131d are not symmetric about the origin. However, embodiments of of the present disclosure are not limited thereto.

Figure 10:
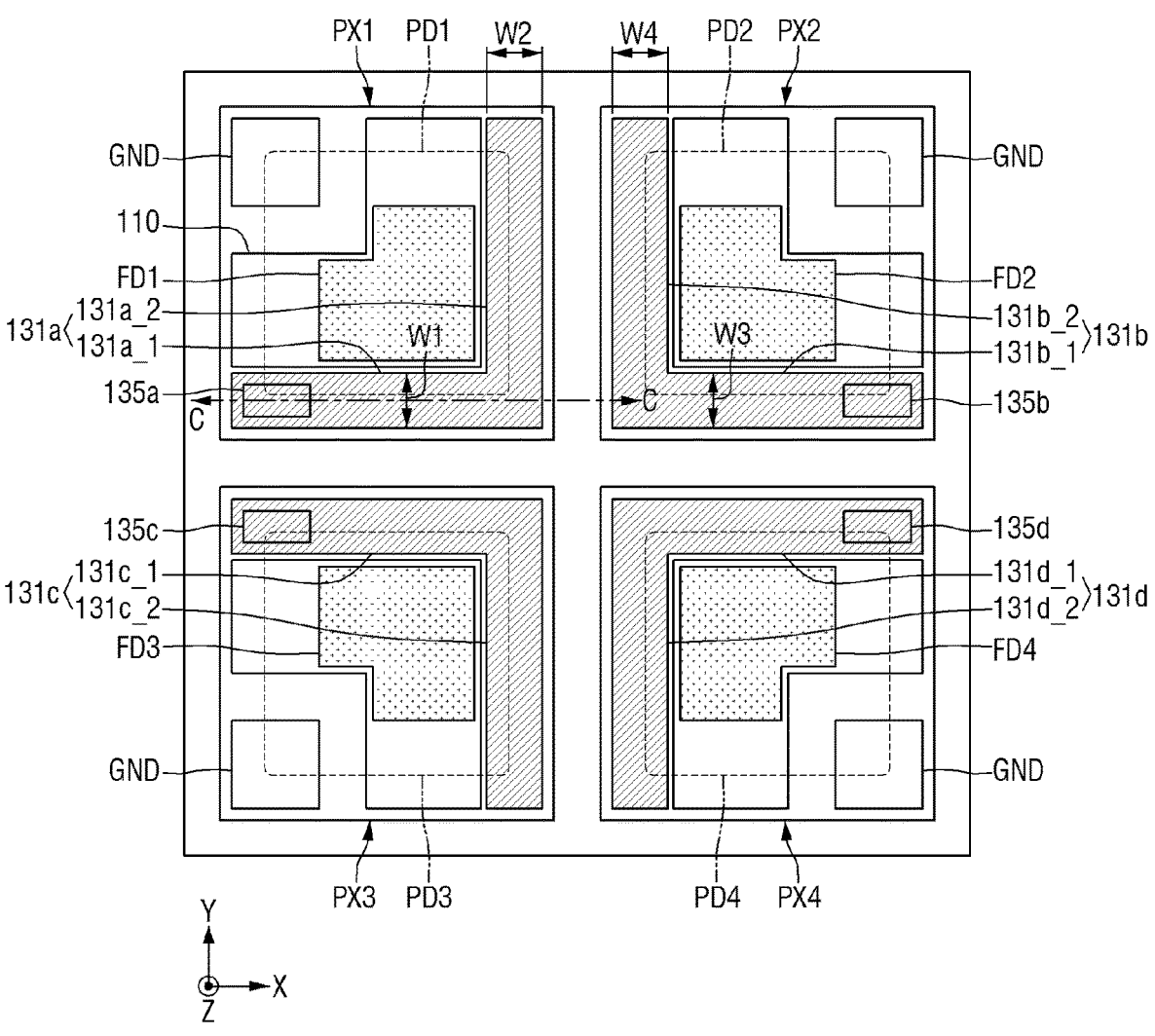
FIG. 10 is a plan view of an image sensor according to some embodiments.
Figure 11:
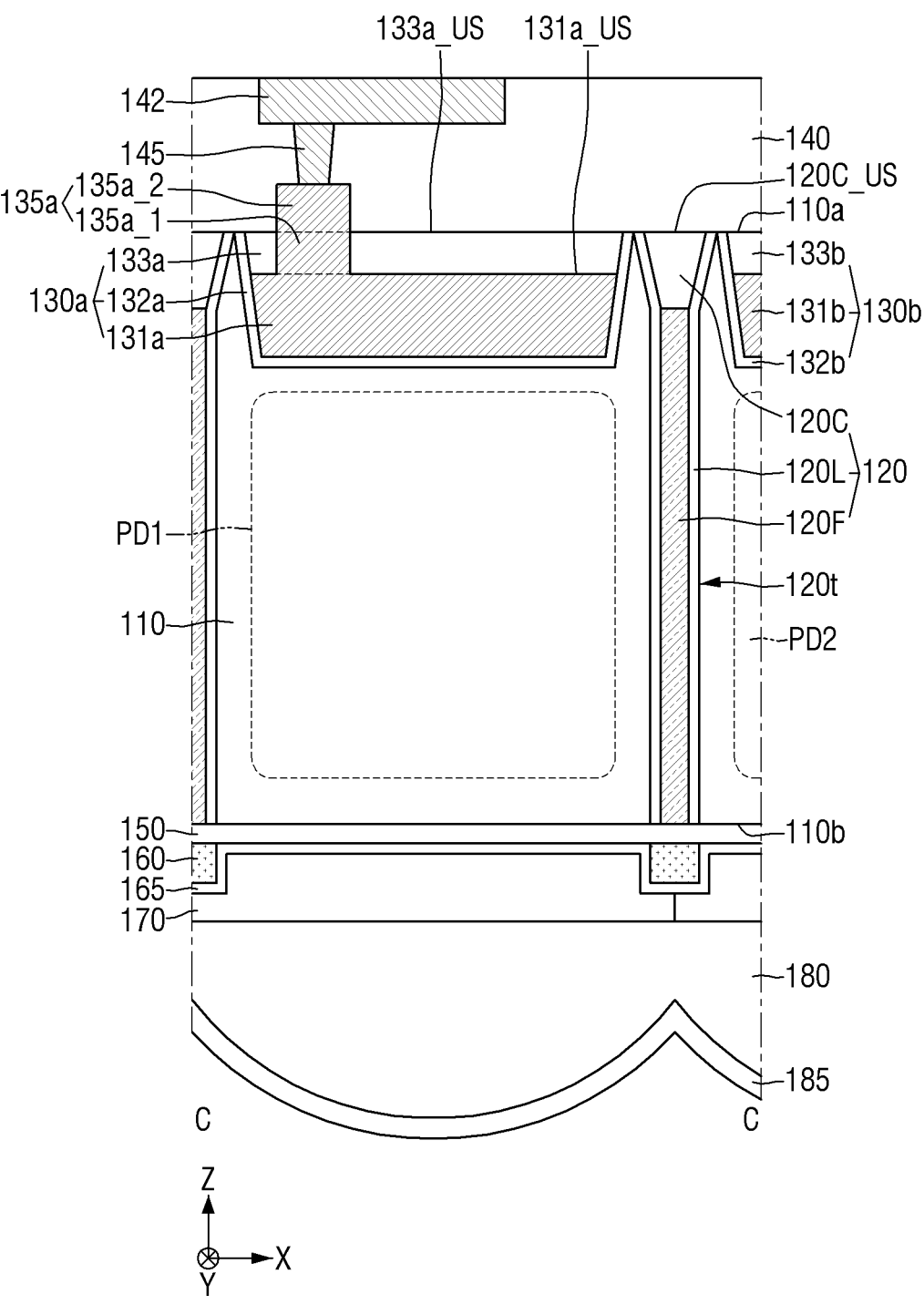
FIG. 11 is a cross-sectional view taken along line C-C of FIG. 10.

FIG. 10 is a plan view of an image sensor according to some embodiments. FIG. 11 is a cross-sectional view taken along line C-C of FIG. 10. For simplicity of description, the following description will focus on differences from the description with reference to FIGS. 6 to 8.

Referring to FIGS. 10 and 11, in some embodiments, the first via 135a does not overlap the pixel isolation pattern 120 in the third direction Z.

The second via 135b, the third via 135c, and the fourth via 135d do not overlap the pixel isolation pattern 120 in the third direction Z. The first via 135a completely overlaps the first gate electrode 131a in the third direction Z. The second via 135b completely overlaps the second gate electrode 131b in the third direction Z. The third via 135c completely overlaps the third gate electrode 131c in the third direction Z. The fourth via 135d completely overlaps the fourth gate electrode 131d in the third direction Z.

Although the first to fourth vias 135a, 135b, 135c, and 135d are illustrated as overlapping the ground region GND in the second direction Y, this is for convenience of description, and embodiments of the present disclosure are not limited thereto. In some embodiments, the first to fourth vias 135a, 135b, 135c, and 135d are formed at positions that do not overlap the first to fourth floating diffusion regions FD1, FD2, FD3, and FD4 in the second direction Y.

In FIG. 11, the first via 135a includes the first region 135a_1 that penetrates through the first gate capping layer 133a, and the second region 135a_2 that protrudes from the front surface 110a of the first substrate 110. The width of the first region 135a_1 of the first via 135a in the first direction X is equal to the width of the second region 135a_2 of the first via 135a in the first direction X.

Figure 12:
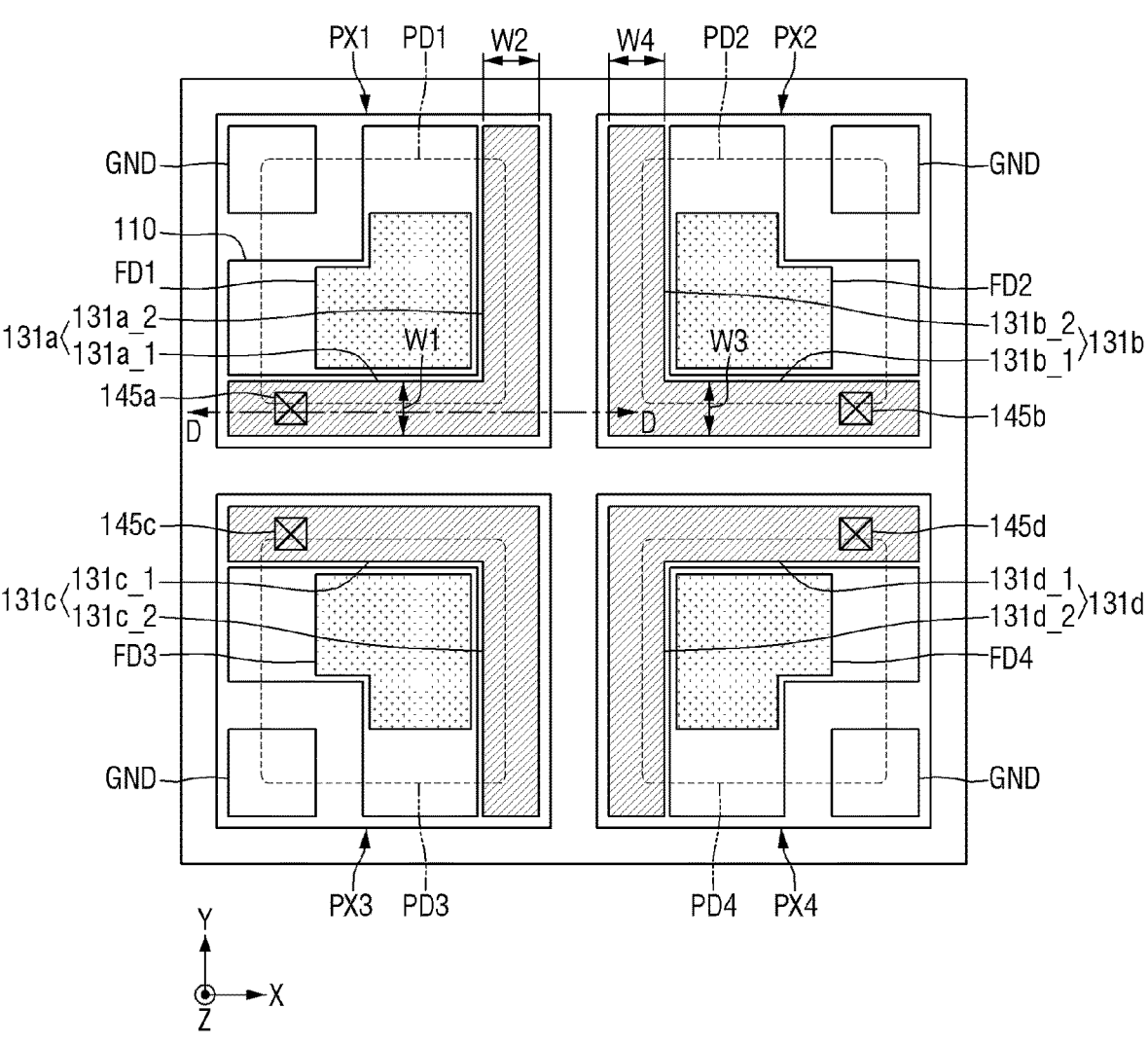
FIG. 12 is a plan view of an image sensor according to some embodiments.
Figure 13:
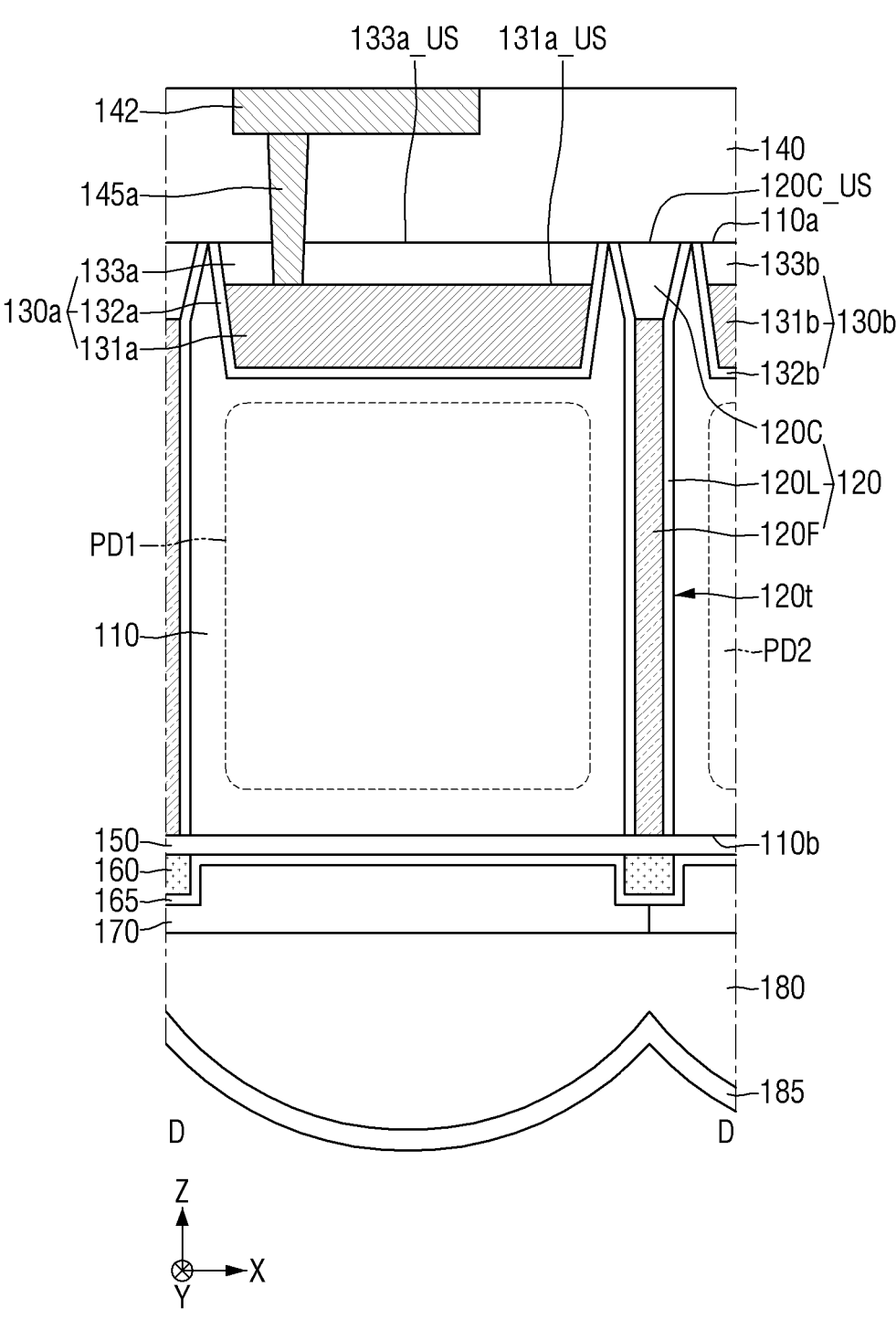
FIG. 13 is a cross-sectional view taken along line D-D of FIG. 12.

FIG. 12 is a plan view of an image sensor according to some embodiments. FIG. 13 is a cross-sectional view taken along line D-D of FIG. 12. For simplicity of description, the following description will focus on differences from the description with reference to FIGS. 6 to 8.

Referring to FIGS. 12 and 13, an image sensor according to some embodiments does not include the first to fourth vias 135a, 135b, 135c, and 135d.

A first via contact 145a is disposed on the first gate electrode 131a. A second via contact 145b is disposed on the second gate electrode 131b. A third via contact 145c is disposed on the third gate electrode 131c. A fourth via contact 145d is disposed on the fourth gate electrode 131d. The first via contact 145a completely overlaps the first gate electrode 131a in the third direction Z. The second via contact 145b completely overlaps the second gate electrode 131b in the third direction Z. The third via contact 145c completely overlaps the third gate electrode 131c in the third direction Z. The fourth via contact 145d completely overlaps the fourth gate electrode 131d in the third direction Z.

The first via contact 145a is directly connected to the first gate electrode 131a. The first via contact 145a penetrates the first gate capping layer 133a. The first via contact 145a protrudes above the front surface 110a of the first substrate 110 and is connected to the first wiring pattern 142.

A description of the second to fourth via contacts 145b, 145c, and 145d is substantially the same as the description of the first via contact 145a.

Figure 14:
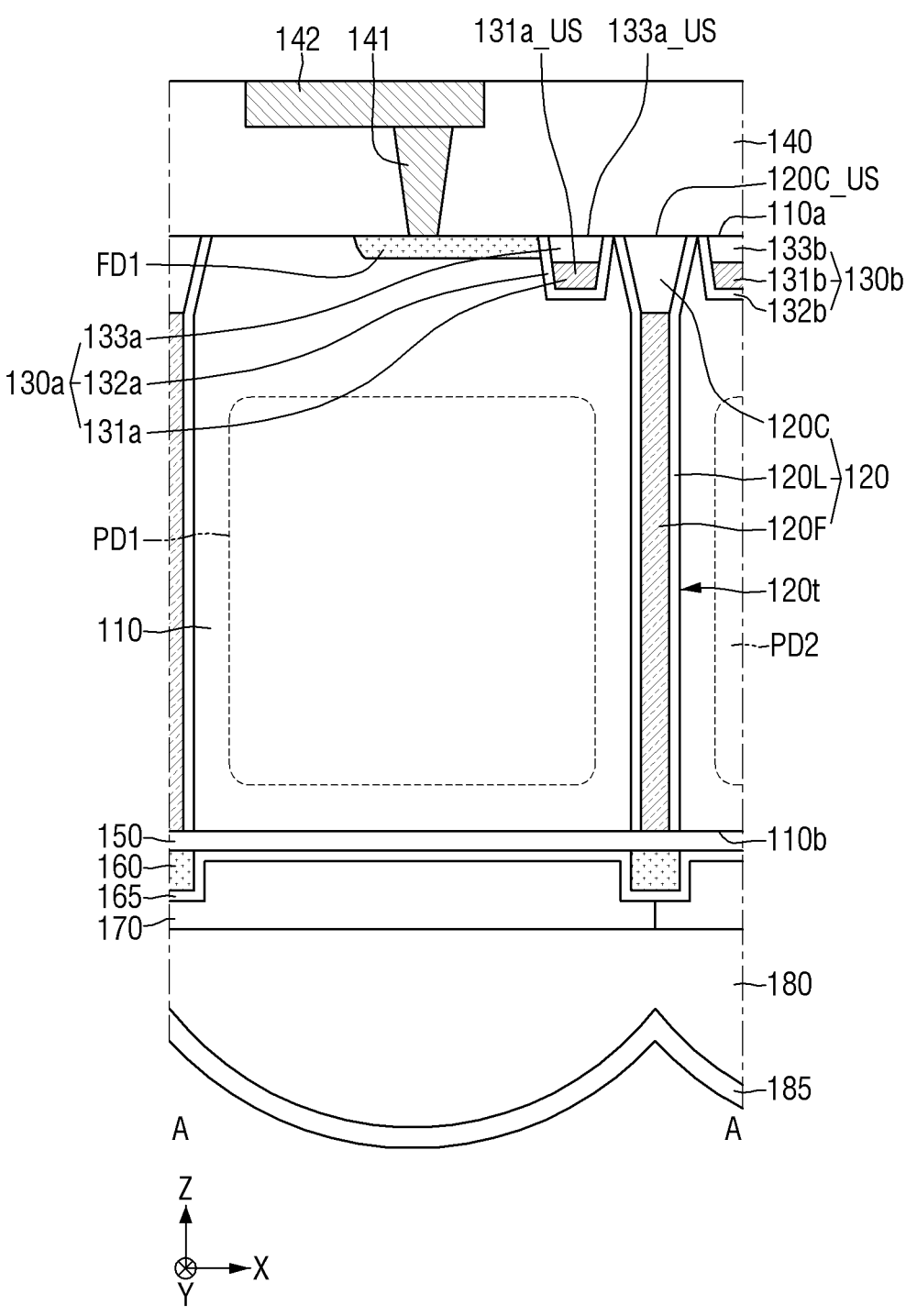
FIG. 14 is a cross-sectional view of an image sensor according to some embodiments.

FIG. 14 is a cross-sectional view of an image sensor according to some embodiments.

Referring to FIG. 14, in some embodiments, the first gate electrode 131*a* and the second gate electrode 131*b* do not completely overlap the pixel isolation filling layer 120F in the first direction X. For example, with respect to the rear surface 110*b* of the first substrate 110, the bottom surfaces of the first gate electrode 131*a* and the second gate electrode 131*b* are higher than the top surface of the pixel isolation filling layer 120F.

FIGS. 15 to 30 illustrate intermediate steps of a method for fabricating an image sensor according to some embodiments. For reference, FIGS. 15 to 30 illustrate a method for fabricating an image sensor having a plan and cross section of FIGS. 6 to 8. Hereinafter, a method for fabricating an image sensor according to some embodiments will be described with reference to FIGS. 15 to 30.

Figure 15:
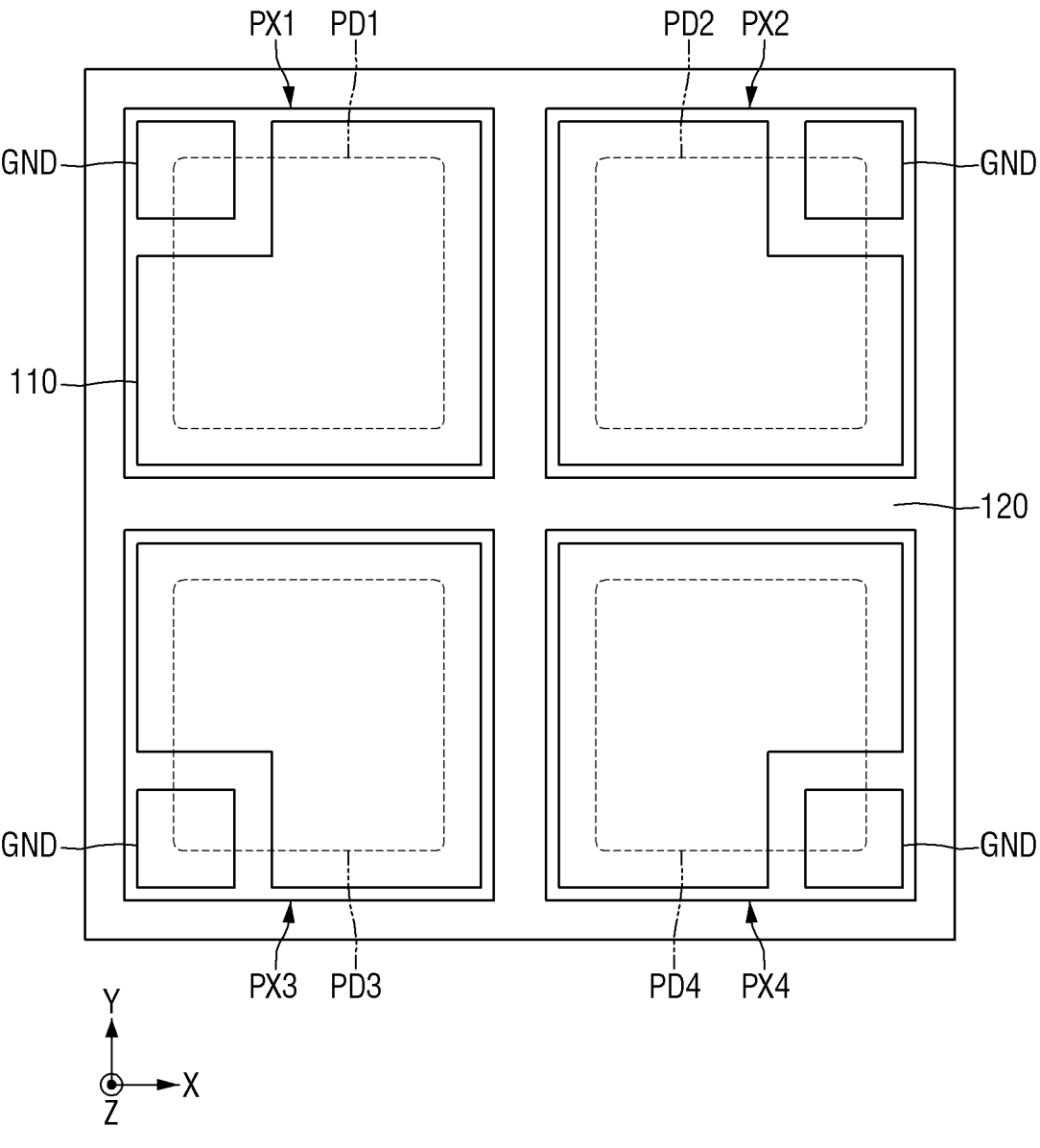
FIGS. 15 to 30 illustrate intermediate steps of a method for fabricating an image sensor according to some embodiments.

Referring to FIG. 15, in an embodiment, the first substrate 110 is provided. The first substrate 110 includes the ground region GND. The ground region GND is defined by an element isolation layer.

The pixel isolation pattern 120 penetrates the first substrate 110 in the third direction Z and has a grid shape. The pixel isolation pattern 120 defines the unit pixels PX1, PX2, PX3, and PX4. The first unit pixel PX1 is spaced apart from the second unit pixel PX2 in the first direction X. The third unit pixel PX3 is spaced apart from the first unit pixel PX1 in the second direction Y. The fourth unit pixel PX4 is spaced apart from the third unit pixel PX3 in the first direction X and from the second unit pixel PX2 in the second direction Y.

The first unit pixel PX1 includes the first photoelectric conversion layer PD1. The second unit pixel PX2 includes the second photoelectric conversion layer PD2. The third unit pixel PX3 includes the third photoelectric conversion layer PD3. The fourth unit pixel PX4 includes the fourth photoelectric conversion layer PD4. The first to fourth photoelectric conversion layers PD1, PD2, PD3, and PD4 are formed in the first substrate 110.

Figure 16:
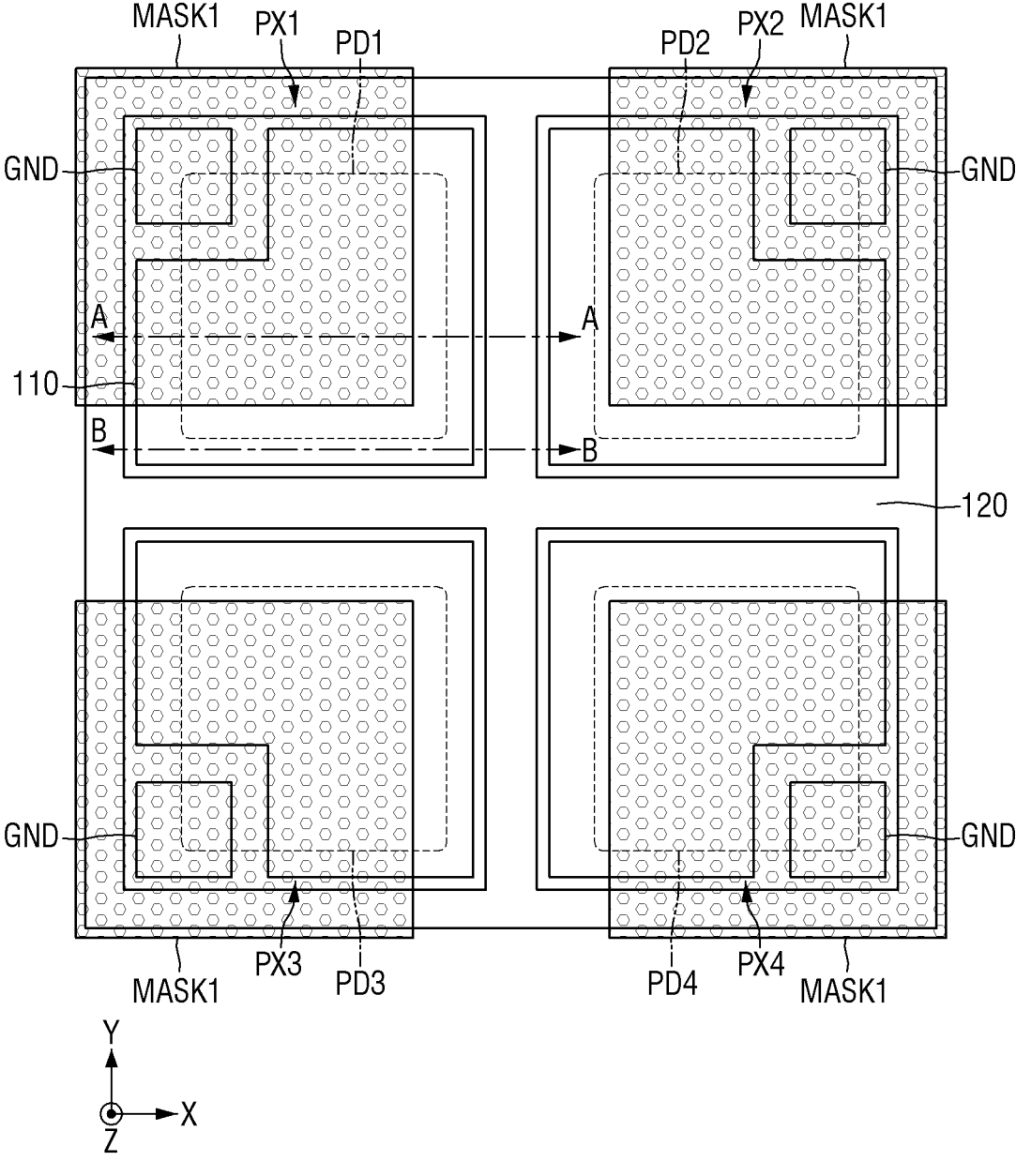
Figure 17:
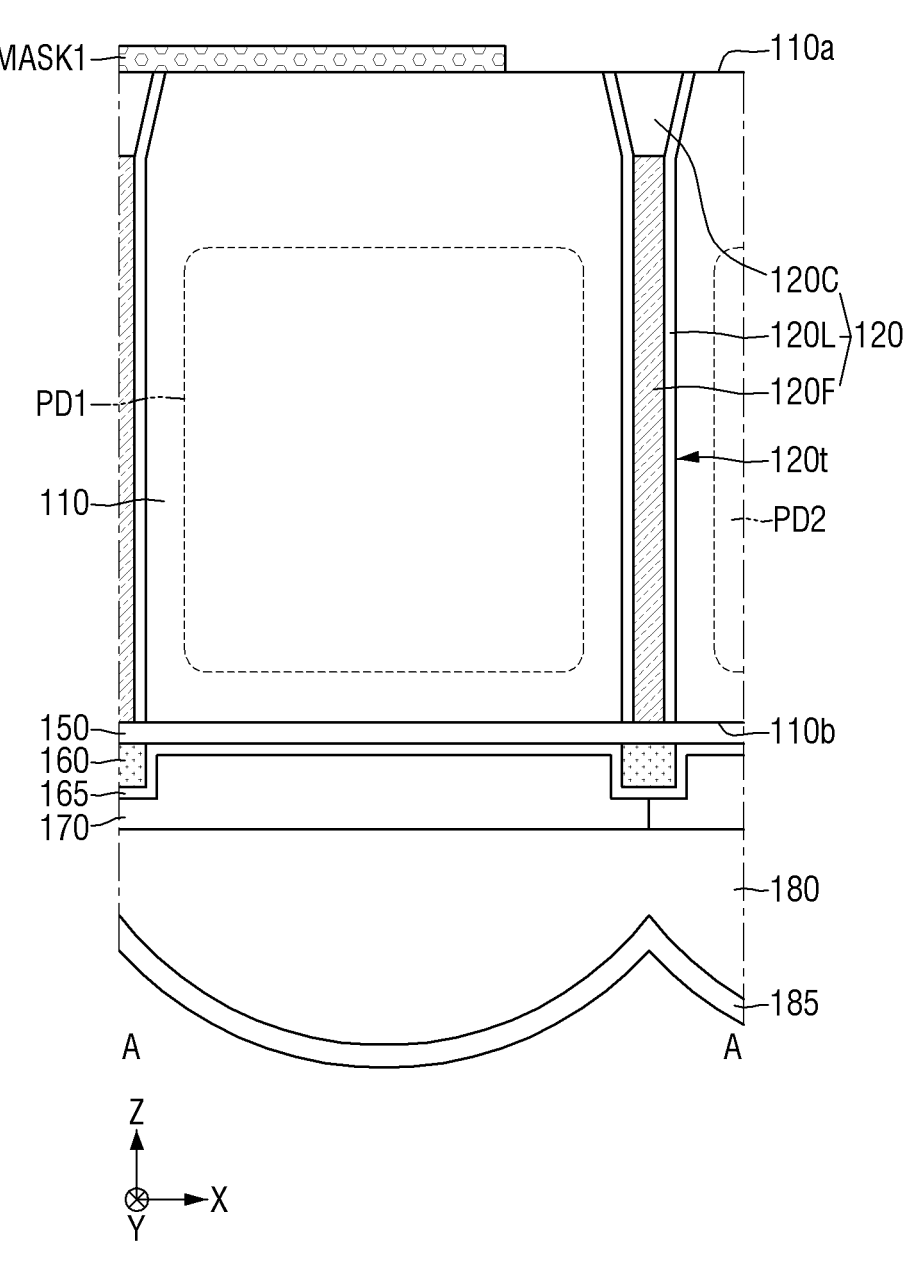
Figure 18:
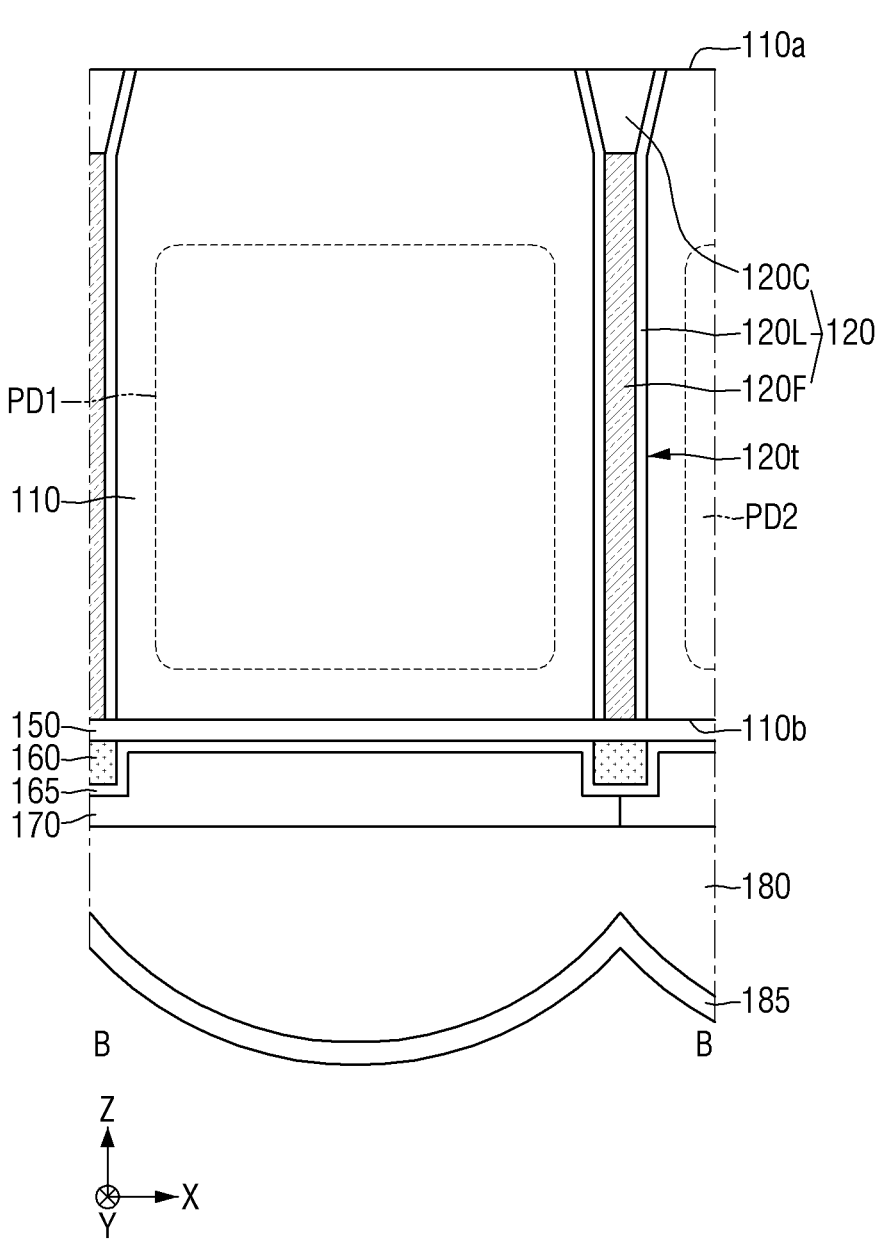

FIG. 16 is a plan view that illustrates an intermediate step of a method for fabricating an image sensor according to some embodiments. FIG. 17 is a cross-sectional view taken along line A-A of FIG. 16. FIG. 18 is a cross-sectional view taken along line B-B of FIG. 16.

Referring to FIGS. 16 to 18, in some embodiments, a first mask pattern MASK1 is formed on the first substrate 110.

The first mask pattern MASK1 is used to form a transfer transistor. The first mask pattern MASK1 is used to form a gate electrode of the transfer transistor. The first mask pattern MASK1 covers the ground region GND and a part of the first substrate 110. The first mask pattern MASK1 covers a part of the pixel isolation pattern 120. The first mask pattern MASK1 may be a hard mask layer or a photoresist layer, but embodiments are not limited thereto.

Figure 19:
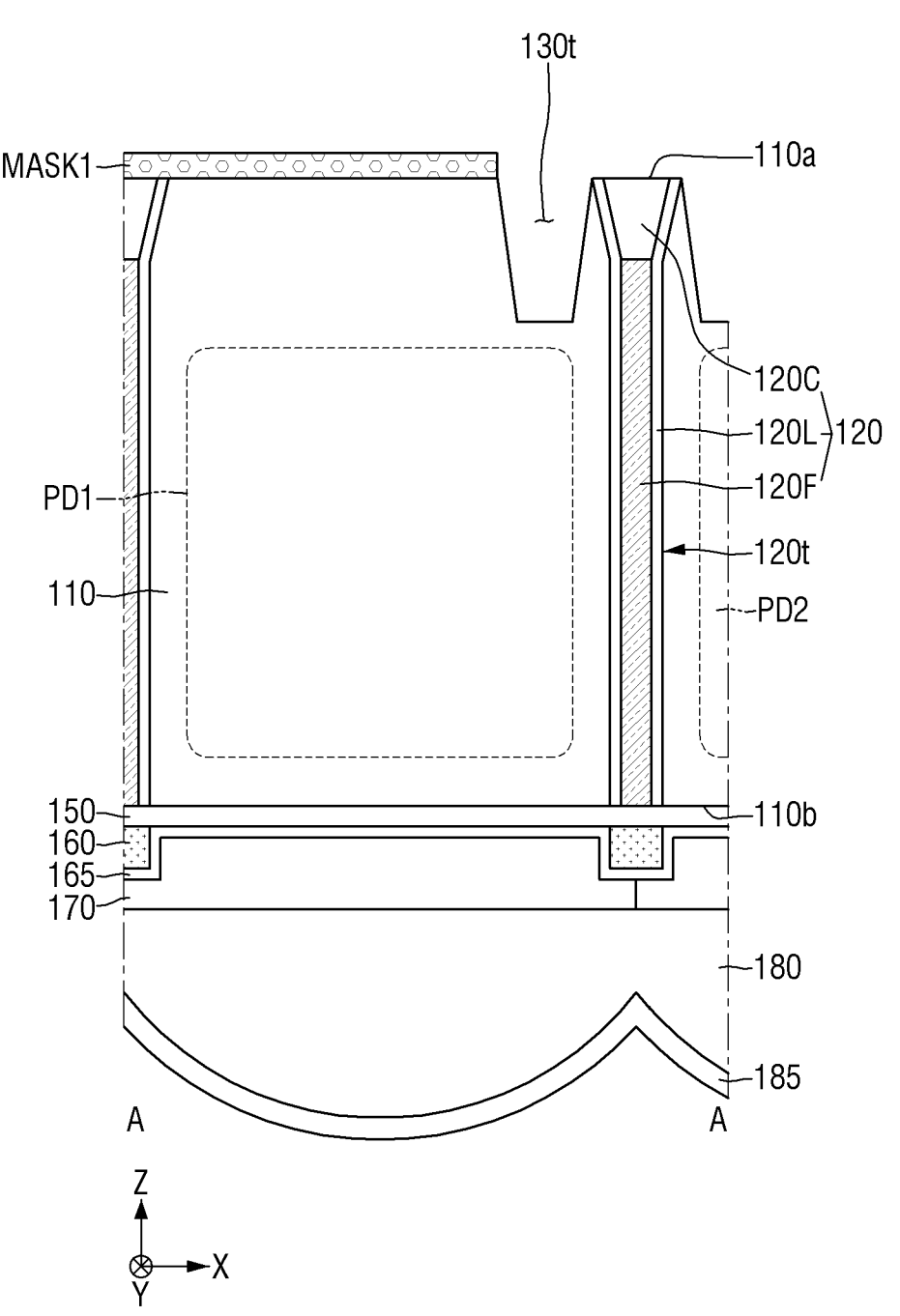
Figure 20:
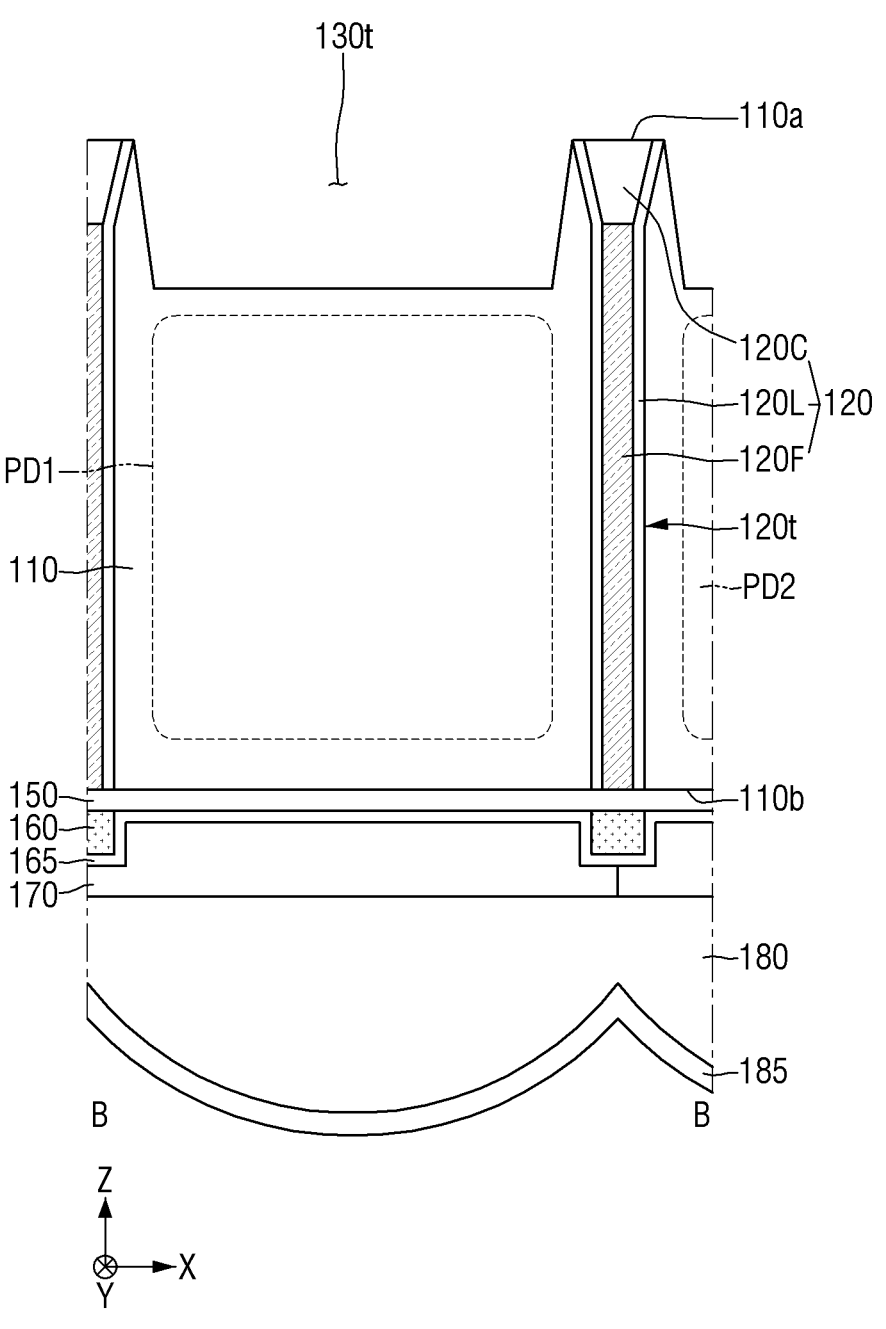

FIG. 17 is a cross-sectional view taken along line A-A of FIG. 16. FIG. 20 is a cross-sectional view taken along line B-B of FIG. 16. Referring to FIGS. 19 and 20, in some embodiments, a gate trench 130*t* is formed by using the first mask pattern MASK1 as an etching mask.

The gate trench 130*t* is formed using a dry etching process. When etching the gate trench 130*t*, an etchant that has an etching selectivity between that of silicon (Si) and silicon oxide (SiO$_2$) is used. Accordingly, silicon (Si) is selectively removed. For example, only the first substrate 110, which is formed of silicon, is etched, while the pixel isolation pattern 120, which is formed of silicon oxide, is not etched.

In some embodiments, the gate trench 130*t* is recessed deeper than the top surface of the pixel isolation filling layer 120F. With respect to the rear surface 110*b* of the first substrate 110A, the bottom surface of the gate trench 130*t* is lower than the top surface of the pixel isolation filling layer 120F.

Figure 21:
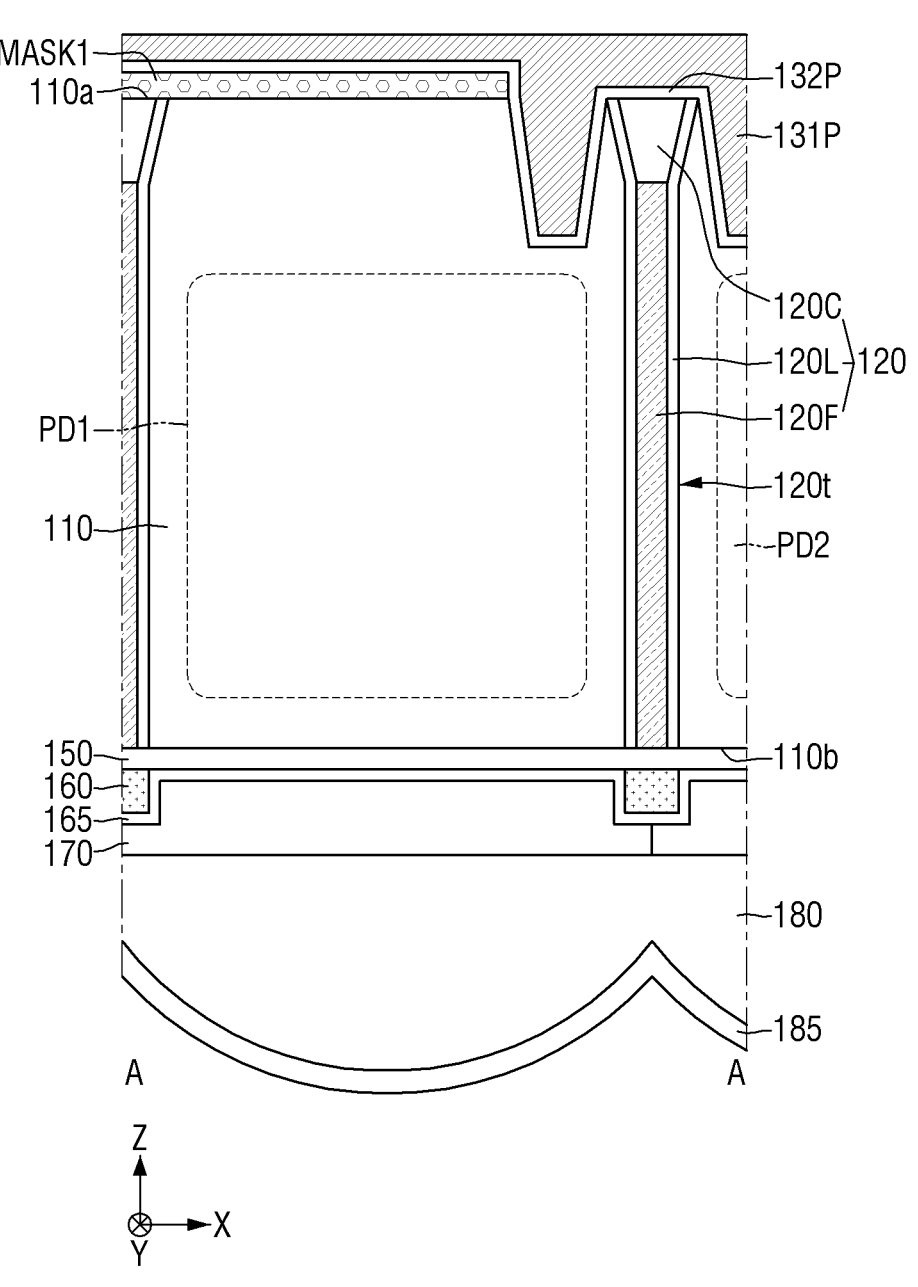
Figure 22:
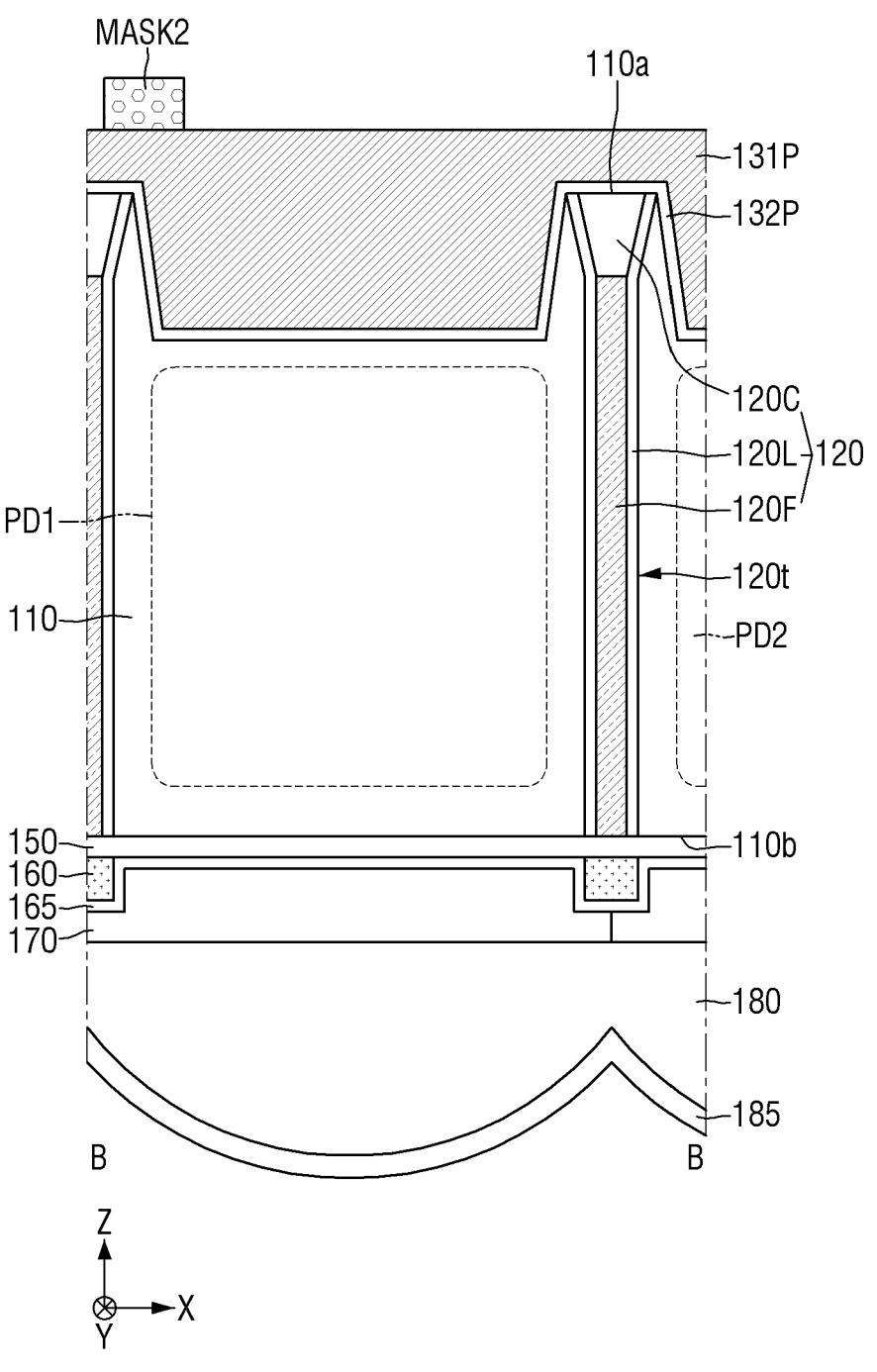

FIG. 21 is a cross-sectional view taken along line A-A of FIG. 16. FIG. 22 is a cross-sectional view taken along line B-B of FIG. 16. Referring to FIGS. 21 and 22, in some embodiments, a pre-gate insulating layer 132P and a pre-gate electrode 131P on the pre-gate insulating layer 132P are formed.

The pre-gate insulating layer 132P is formed along the sidewall of the gate trench 130*t*, the bottom surface of the gate trench 130*t*, the top surface of the first mask pattern MASK1, and the top surface of the pixel isolation pattern 120. The pre-gate insulating layer 132P may be formed using chemical vapor deposition (CVD) or atomic layer deposition (ALD), but embodiments are not limited thereto. The pre-gate insulating layer 132P includes an insulating material. For example, the pre-gate insulating layer 132P includes silicon oxide.

The pre-gate electrode 131P is formed on the pre-gate insulating layer 132P. The pre-gate electrode 131P fills the remaining portion of the gate trench 130*t* after the pre-gate insulating layer 132P is formed therein. In addition, the pre-gate electrode 131P is formed on the first mask pattern MASK1 and the pixel isolation pattern 120. The pre-gate electrode 131P includes a conductive material. For example, the pre-gate electrode 131P includes polysilicon, but embodiments are not limited thereto.

Subsequently, a second mask pattern MASK2 is formed on the pre-gate electrode 131P. The second mask pattern MASK2 is used to form the first to fourth vias 135*a*, 135*b*, 135*c*, and 135*d* of FIG. 6. A part of the second mask pattern MASK2 overlaps the pixel isolation pattern 120 in the third direction Z. A part of the second mask pattern MASK2 overlaps the first substrate 110 in the third direction Z. However, embodiments of the present disclosure are not limited thereto. The second mask pattern MASK2 may be a hard mask layer or a photoresist layer, but embodiments are not limited thereto.

Figure 23:
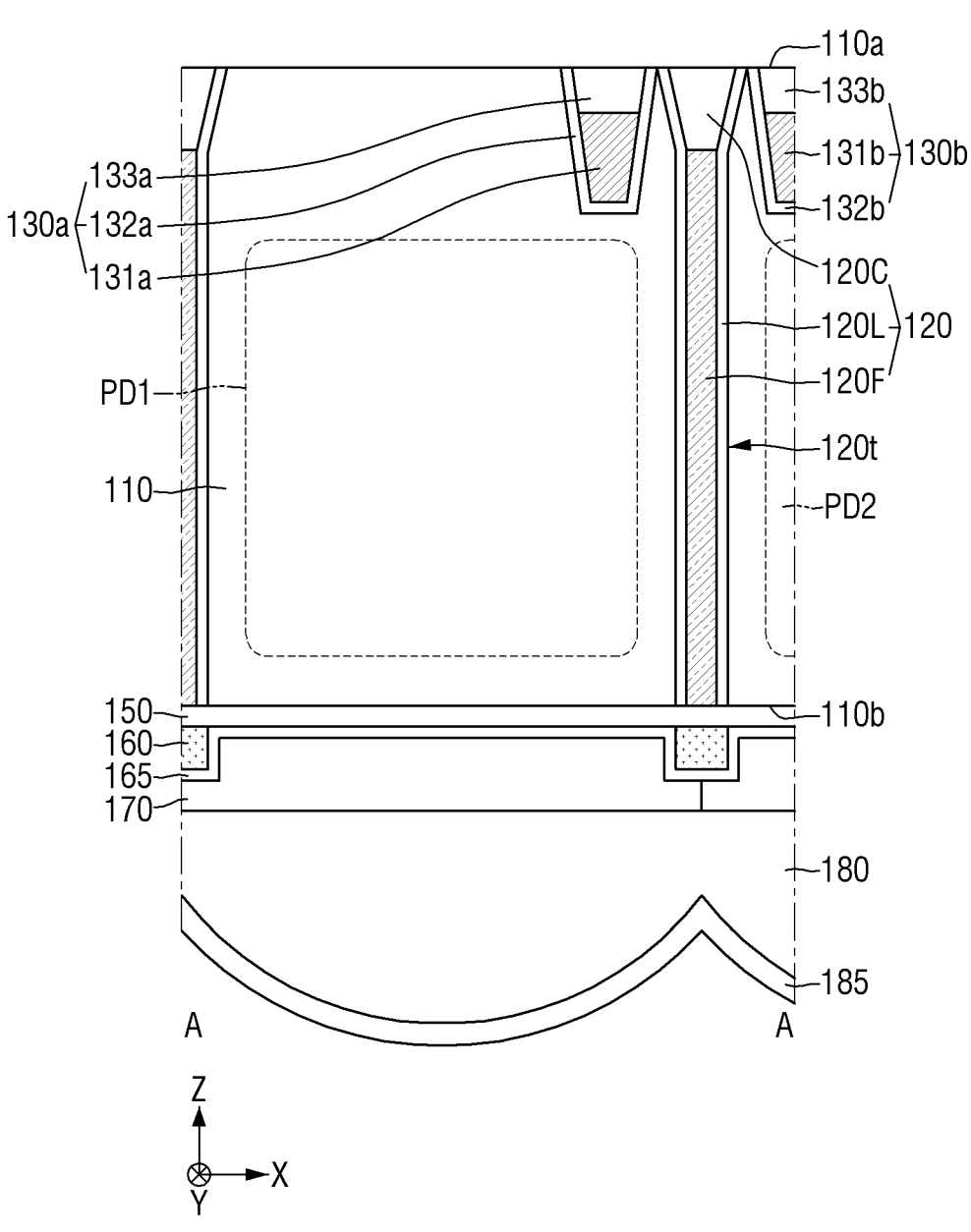
Figure 24:
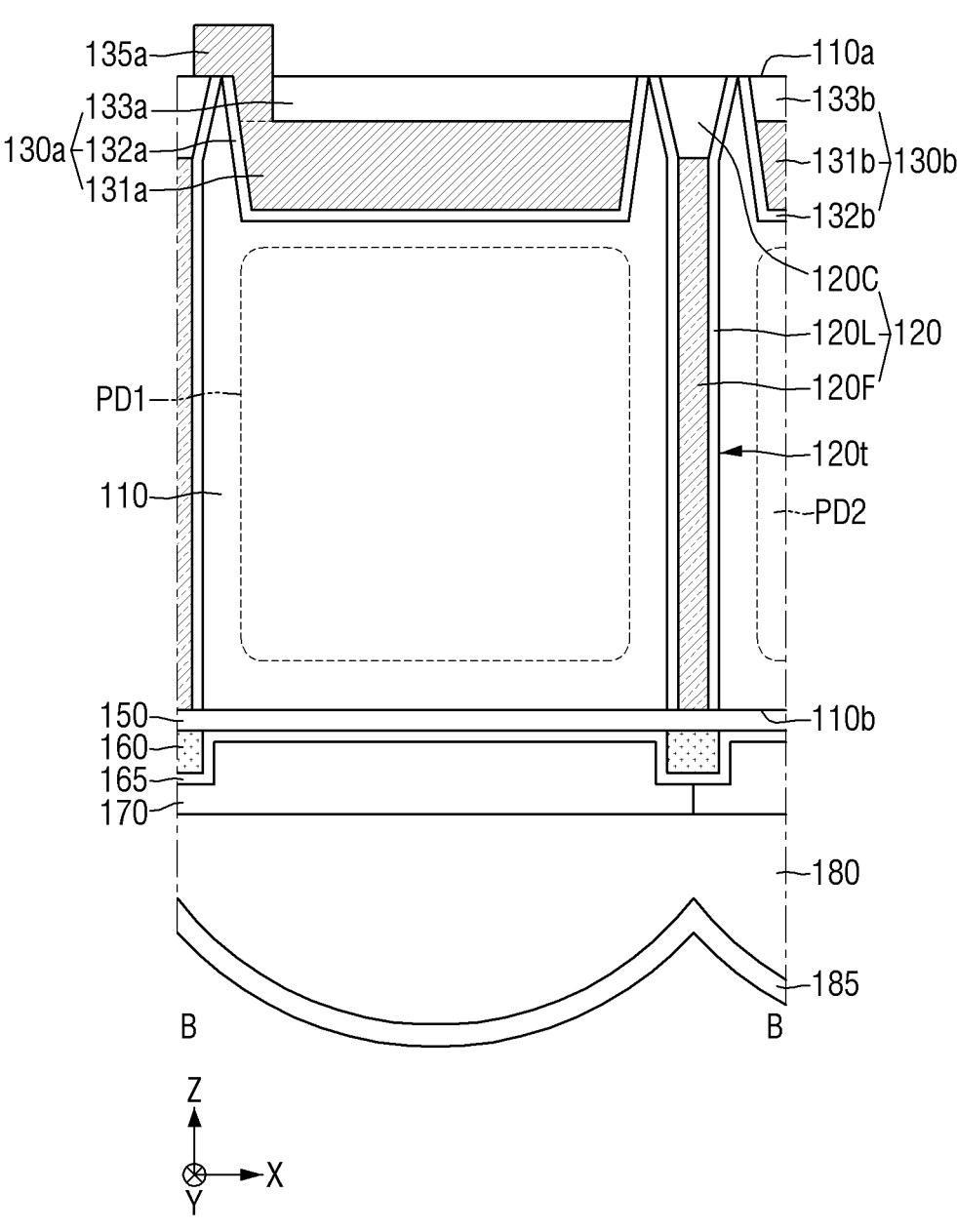

FIG. 17 is a cross-sectional view taken along line A-A of FIG. 16. FIG. 20 is a cross-sectional view taken along line B-B of FIG. 16. Referring to FIGS. 23 and 24, in some embodiments, the first transfer transistor 130*a* and the second transfer transistor 130*b* are formed. In addition, the third transfer transistor and the fourth transfer transistor are also formed.

First, the pre-gate electrode 131P and the first mask pattern MASK1 are etched. The pre-gate electrode 131P is etched to form the first gate electrode 131*a* and the second gate electrode 131*b*. Similarly, the pre-gate electrode 131P is etched to form the third gate electrode (131*c* of FIG. 6) and the fourth gate electrode (131*d* of FIG. 6).

The first via 135*a* is formed using the second mask pattern MASK2 as an etching mask. Similarly, the second to fourth vias 135*b*, 135*c*, and 135*d* are also formed. The first via 135*a* is formed by etching the pre-gate electrode 131P. For example, the material in the first via 135*a* is the same as the material in the first gate electrode 131*a*.

Subsequently, a pre-gate capping layer is formed on the first gate electrode 131*a* and the second gate electrode 131*b*. The pre-gate capping layer covers the first gate electrode 131*a*, the second gate electrode 131*b*, and the first via 135*a*.

Subsequently, the first gate capping layer 133a and the second gate capping layer 133b are formed by etching the pre-gate capping layer.

Figure 25:
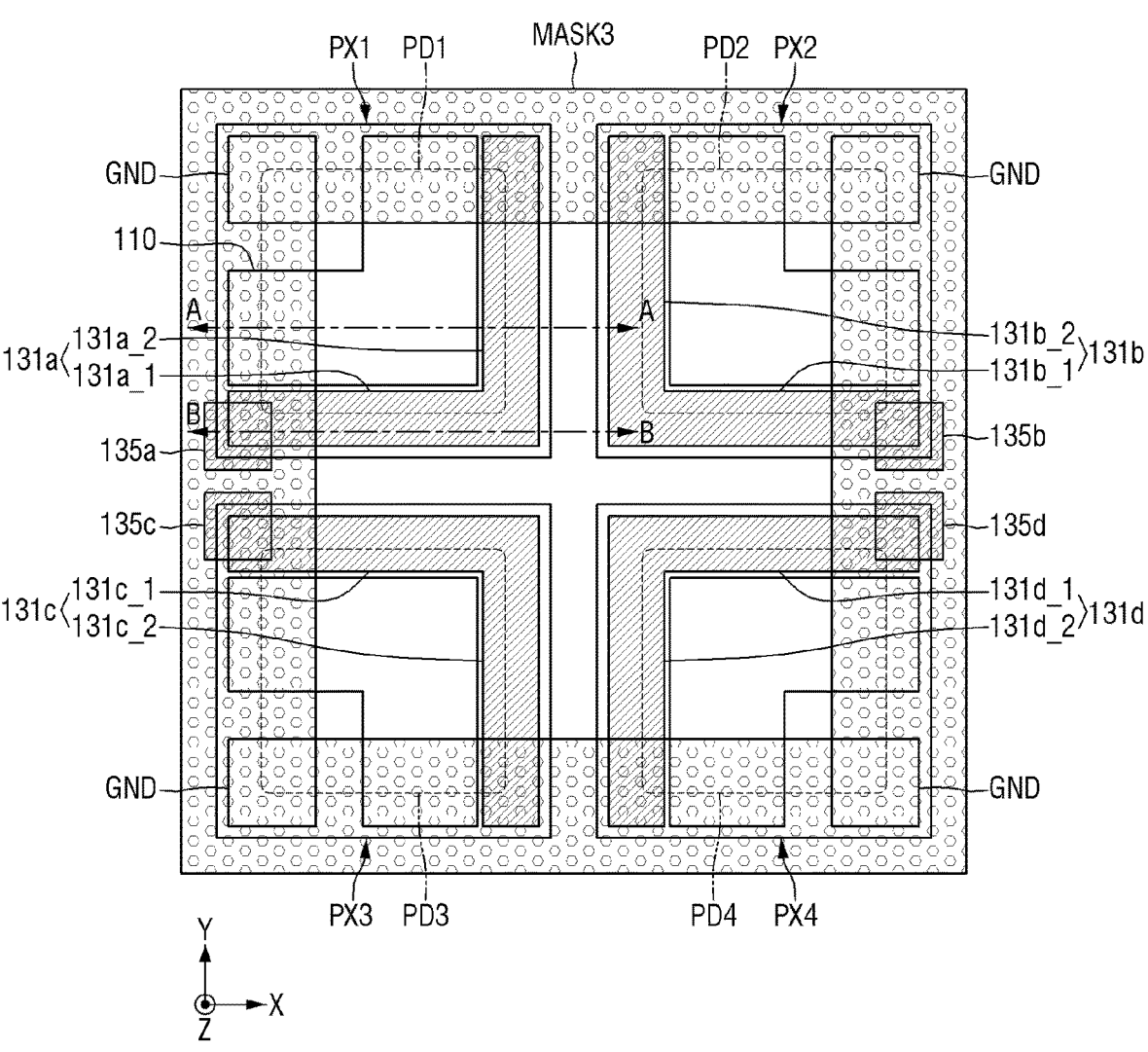
Figure 26:
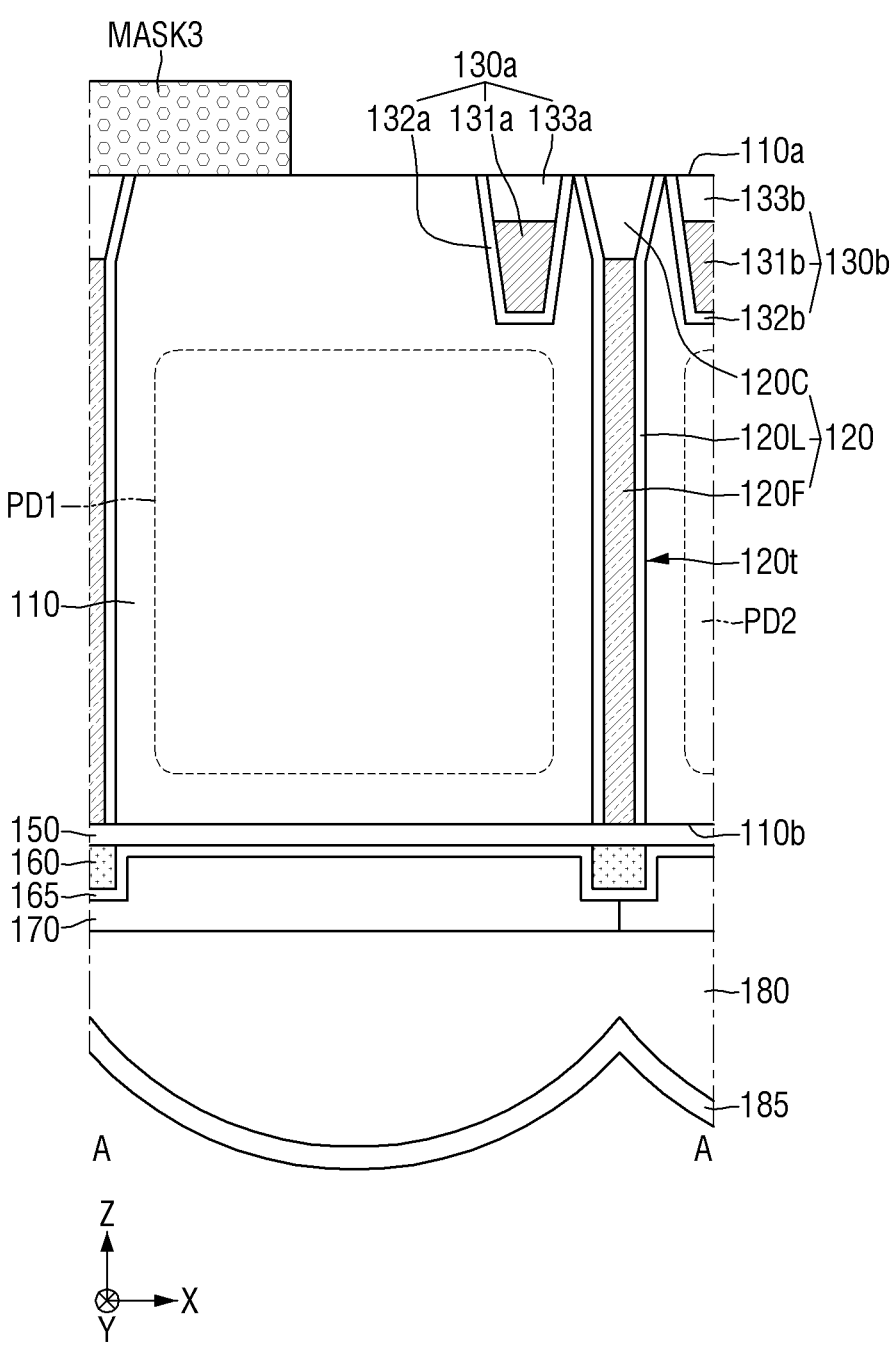
Figure 27:
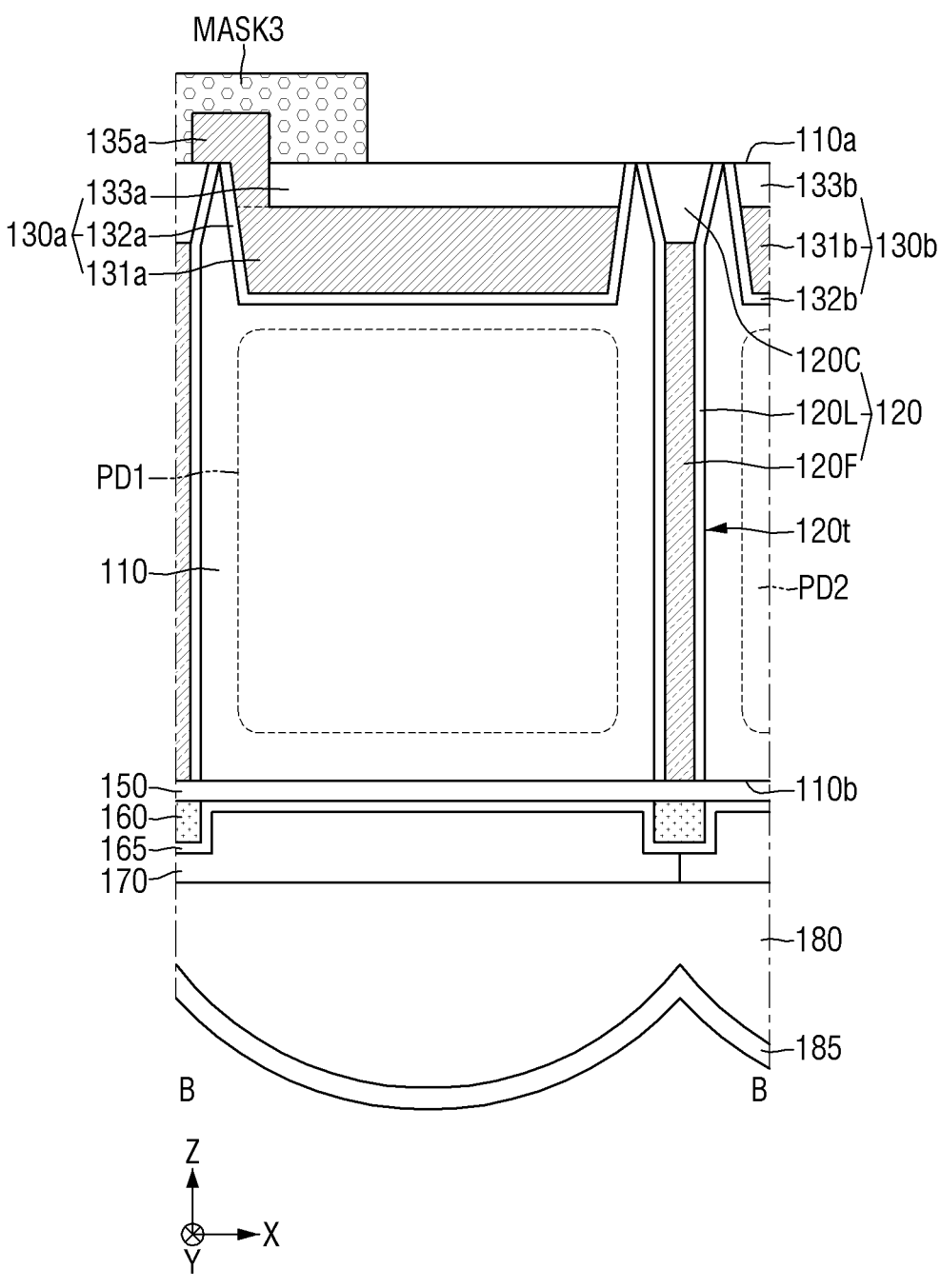

FIG. 25 is a plan view that illustrates an intermediate step of a method for fabricating an image sensor according to some embodiments. FIG. 26 is a cross-sectional view taken along line A-A of FIG. 25. FIG. 27 is a cross-sectional view taken along line B-B of FIG. 25.

Referring to FIGS. 25 to 27, in some embodiments, a third mask pattern MASK3 is formed that covers the first substrate 110, the first via 135a, and a part of the pixel isolation pattern 120.

The third mask pattern MASK3 covers the first substrate 110, the ground region GND, a part of the pixel isolation pattern 120, a part of the first to fourth gate electrodes 131a, 131b, 131c, and 131d, and the first to fourth vias 135a, 135b, 135c, and 135d. The third mask pattern MASK3 is used to form the first to fourth floating diffusion regions FD1, FD2, FD3, and FD4. The third mask pattern MASK3 may be, for example, a hard mask layer or a photoresist layer, but embodiments are not limited thereto.

Figure 28:
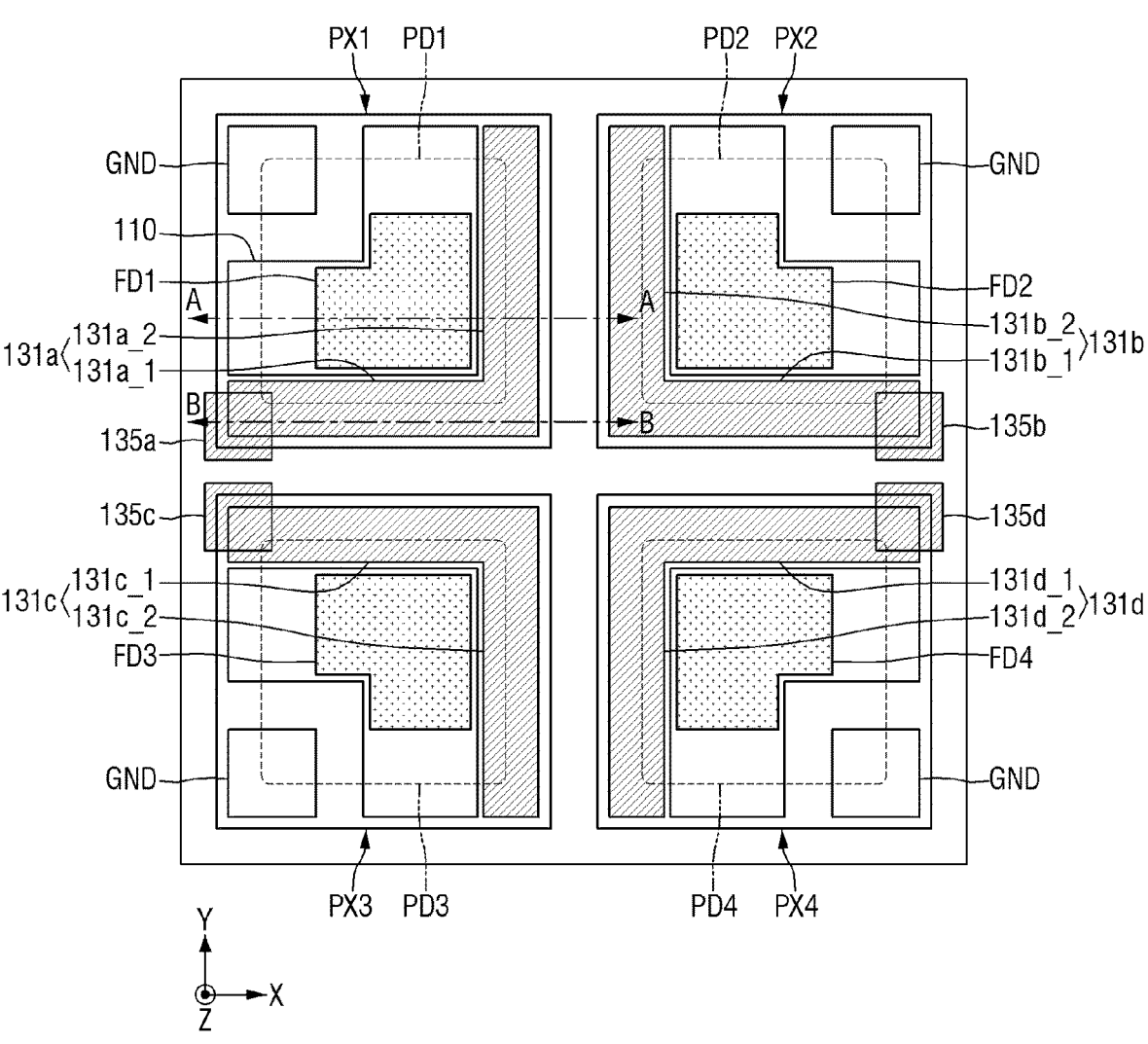
Figure 29:
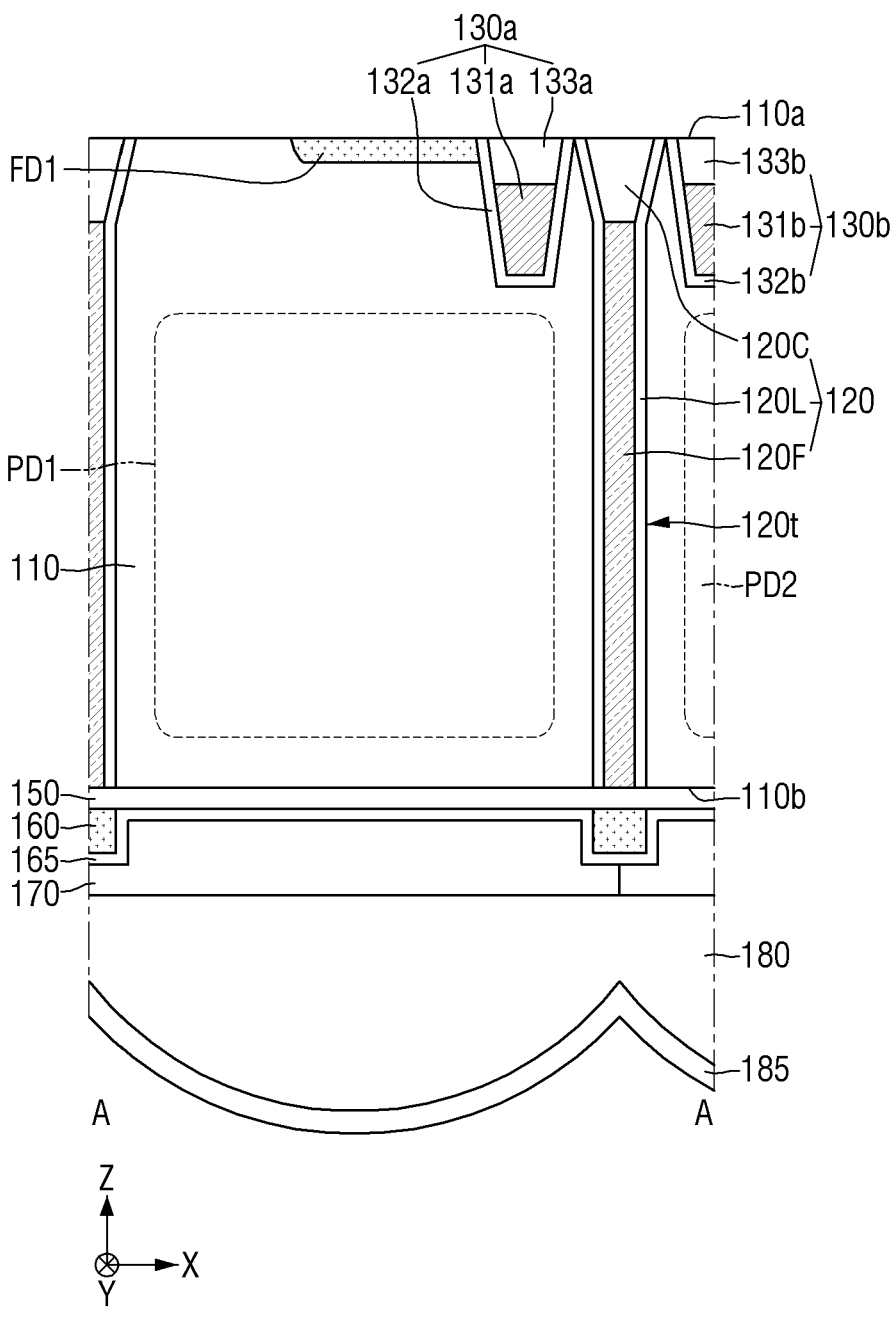
Figure 30:
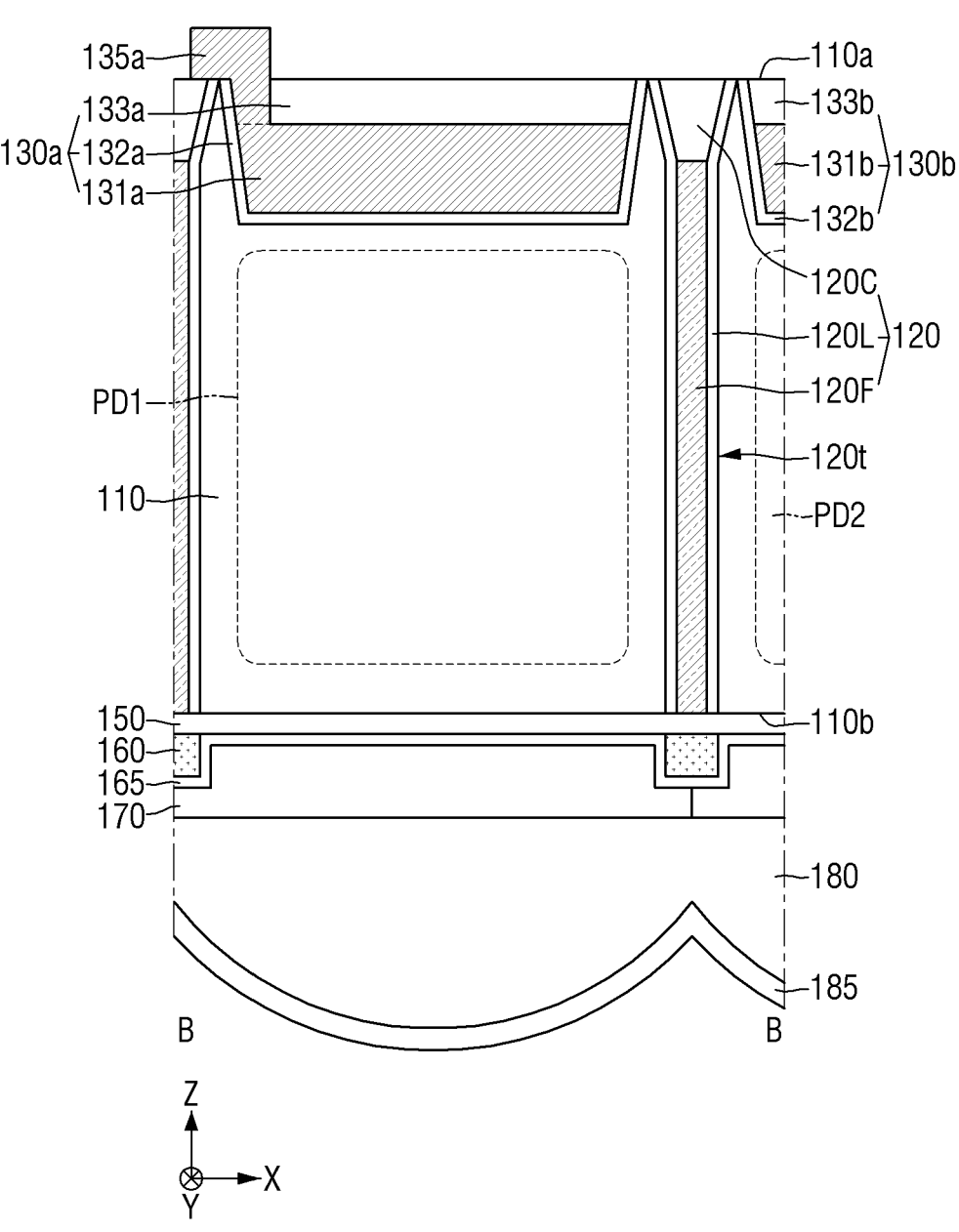

FIG. 28 is a plan view that illustrates an intermediate step of a method for fabricating an image sensor according to some embodiments. FIG. 29 is a cross-sectional view taken along line A-A of FIG. 28. FIG. 30 is a cross-sectional view taken along line B-B of FIG. 28.

Referring to FIGS. 28 to 30, in some embodiments, the first to fourth floating diffusion regions FD1, FD2, FD3, and FD4 are formed in the first substrate 110.

The first to fourth floating diffusion regions FD1, FD2, FD3, and FD4 are formed by doping impurities in the first substrate 110. The first to fourth floating diffusion regions FD1, FD2, FD3, and FD4 are formed by doping impurities on the portion of the first substrate 110 that is not covered with the third mask pattern MASK3.

The first floating diffusion region FD1 does not overlap the first gate electrode 131a in the first direction X, the second direction Y, or the third direction Z. Accordingly, a leakage current flow between the first floating diffusion region FD1 and the first gate electrode 131a can be prevented. In addition, in FIG. 28, the first gate electrode 131a is disposed along the bottom side and the right side of the top surface of the first floating diffusion region FD1. This has an effect similar to that of a dual transfer transistor.

In concluding the detailed description, those skilled in the art will appreciate that many variations and modifications may be made to embodiments without substantially departing from the principles of the present disclosure. Therefore, embodiments of the disclosure are used in a generic and descriptive sense only and not for purposes of limitation.

What is claimed is:

1. An image sensor, comprising:
a substrate that includes a front surface and a rear surface that are opposite to each other;
a plurality of unit pixels disposed in the substrate, wherein each unit pixel includes a photoelectric conversion layer, a floating diffusion region, and a transfer transistor that electrically connects the photoelectric conversion layer to the floating diffusion region;
a pixel isolation pattern that penetrates the substrate in a first direction and defines respective unit pixels, wherein the transfer transistor includes a gate electrode that includes a first portion that extends in a second direction along the pixel isolation pattern and a second portion that extends in a third direction along the pixel isolation pattern;

a via connected to the gate electrode and that protrudes from the front surface of the substrate; and
a microlens disposed on the rear surface of the substrate, wherein
a height from the rear surface of the substrate to a top surface of the gate electrode is less than a thickness of the substrate,
wherein the via overlaps only one of a top surface of the first portion of the gate electrode or a top surface of the second portion of the gate electrode.

2. The image sensor of claim 1, wherein the gate electrode does not overlap the floating diffusion region in the first direction, the second direction, or the third direction.

3. The image sensor of claim 1, wherein the transfer transistor includes a gate capping layer on the gate electrode, and
a top surface of the gate capping layer is coplanar with the front surface of the substrate.

4. The image sensor of claim 3, wherein the gate electrode includes polysilicon, and the gate capping layer includes silicon oxide.

5. The image sensor of claim 1, wherein the pixel isolation pattern includes a pixel isolation liner that extends along an inner wall of a pixel isolation trench, a pixel isolation filling layer disposed within the pixel isolation liner, and a pixel isolation capping layer disposed on the pixel isolation filling layer, and
a top surface of the pixel isolation capping layer is coplanar with the front surface of the substrate.

6. The image sensor of claim 5, wherein at least a part of the gate electrode overlaps the pixel isolation filling layer in the second direction.

7. The image sensor of claim 1, wherein the via includes a first region disposed in the substrate and a second region disposed on the front surface of the substrate.

8. The image sensor of claim 1, further comprising a contact connected to the via,
wherein the gate electrode, the via, and the contact are electrically connected to each other.

9. The image sensor of claim 1, wherein a width of the first portion of the gate electrode in the third direction is equal to a width of the second portion of the gate electrode in the second direction.

10. An image sensor, comprising:
a substrate that includes a front surface and a rear surface that are opposite to each other;
a first unit pixel disposed in the substrate, wherein the first unit pixel includes a first photoelectric conversion layer, a first floating diffusion region, and a first transfer transistor that electrically connects the first photoelectric conversion layer to the first floating diffusion region;
a second unit pixel disposed in the substrate, wherein the second unit pixel is spaced apart from the first unit pixel in a first direction and includes a second photoelectric conversion layer, a second floating diffusion region, and a second transfer transistor that electrically connects the second photoelectric conversion layer to the second floating diffusion region;
a pixel isolation pattern that separates the first unit pixel and the second unit pixel; and
a microlens disposed on the rear surface of the substrate, wherein the first transfer transistor includes a first gate electrode and a first capping layer above the first gate electrode, wherein the first gate electrode includes a first portion that extends in the first direction along a first portion of an outer surface of the first unit pixel, and a second portion that extends in a second direction crossing the first direction along a second portion of the outer surface of the first unit pixel that intersects the first portion of the outer surface of the first unit pixel, the second transfer transistor includes a second gate electrode and a second capping layer above the second gate electrode, wherein the second gate electrode includes a first portion that extends in the first direction along a third portion of an outer surface of the second unit pixel, and a second portion that extends in the second direction along a fourth portion of the outer surface of the second unit pixel that intersects the third portion of the outer surface of the second unit pixel, and the second portion of the outer surface of the first unit pixel and the fourth portion of the outer surface of the second unit pixel face each other in the first direction, and a top surface of the first capping layer and a top surface of the second capping layer are coplanar with the front surface of the substrate.

11. The image sensor of claim 10, wherein the first floating diffusion region does not overlap the first gate electrode in a third direction that intersects the first direction and the second direction.

12. The image sensor of claim 10, further comprising a first via that overlaps at least a part of the first gate electrode in a third direction that intersects the first direction and the second direction, wherein at least a part of the first via overlaps the pixel isolation pattern in the third direction.

13. The image sensor of claim 10, further comprising a second via that overlaps at least a part of the second gate electrode in a third direction that intersects the first direction and the second direction, wherein the second via does not overlap the pixel isolation pattern in the third direction.

14. The image sensor of claim 10, wherein a width in the second direction of the first portion of the first gate electrode is equal to a width in the first direction of the second portion of the first gate electrode.

15. The image sensor of claim 10, wherein a width in the second direction of the first portion of the first gate electrode differs from a width in the first direction of the second portion of the first gate electrode.

16. The image sensor of claim 10, wherein the first portion of the first gate electrode overlaps the first portion of the second gate electrode in the first direction.

17. The image sensor of claim 10, further comprising a third unit pixel that is spaced apart from the first unit pixel in the second direction, and that includes a third photoelectric conversion layer, a third floating diffusion region, and a third transfer transistor that connects the third photoelectric conversion layer to the third floating diffusion region, wherein the pixel isolation pattern separates the first unit pixel and the third unit pixel, the third transfer transistor includes a third gate electrode that includes a first portion that extends in the first direction along a fifth portion of an outer surface of the third unit pixel that faces the pixel isolation pattern in the second direction, and a second portion that extends in the second direction along a sixth portion of the outer surface of the third unit pixel that faces the pixel isolation pattern in the first direction and that intersects the fifth portion of the outer surface of the third unit pixel, and the fifth portion of the outer surface of the third unit pixel faces the first portion of the outer surface of the first unit pixel in the second direction through the pixel isolation pattern but not through the first photoelectric conversion layer or the second photoelectric conversion layer.

18. The image sensor of claim 17, wherein the second portion of the first gate electrode overlaps the second portion of the third gate electrode in the second direction.

19. An image sensor, comprising:

a first semiconductor chip, a second semiconductor chip and a third semiconductor chip that are sequentially stacked in a first direction, wherein the first semiconductor chip includes:

a substrate that includes a front surface and a rear surface that are opposite to each other;

a plurality of unit pixels disposed in the substrate, wherein each unit pixel includes a photoelectric conversion layer, a floating diffusion region, and a transfer transistor that electrically connects the photoelectric conversion layer to the floating diffusion region;

a pixel isolation pattern that penetrates the substrate in the first direction and defines respective unit pixels, wherein the transfer transistor includes a gate electrode that includes a first portion that extends in a second direction along the pixel isolation pattern and a second portion that extends in a third direction along the pixel isolation pattern;

a via connected to the gate electrode and that protrudes from the front surface of the substrate; and a microlens disposed on the rear surface of the substrate, wherein the via overlaps only one of a top surface of the first portion of the gate electrode or a top surface of the second portion of the gate electrode, and a height from the rear surface of the substrate to a top surface of the gate electrode is less than a thickness of the substrate, wherein the second semiconductor chip includes a source follower transistor, a select transistor and a reset transistor that is connected to the floating diffusion region, and wherein the third semiconductor chip includes a plurality of logic circuits that control the source follower transistor, the select transistor, and the reset transistor.

* * * * *